United States Patent
Okahisa et al.

(10) Patent No.: US 8,698,282 B2
(45) Date of Patent: *Apr. 15, 2014

(54) GROUP III NITRIDE SEMICONDUCTOR CRYSTAL SUBSTRATE AND SEMICONDUCTOR DEVICE

(75) Inventors: Takuji Okahisa, Itami (JP); Tomohiro Kawase, Itami (JP); Tomoki Uemura, Itami (JP); Muneyuki Nishioka, Itami (JP); Satoshi Arakawa, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 760 days.

This patent is subject to a terminal disclaimer.

(21) Appl. No.: 12/273,101

(22) Filed: Nov. 18, 2008

(65) Prior Publication Data

US 2009/0127662 A1 May 21, 2009

(30) Foreign Application Priority Data

Nov. 20, 2007 (JP) ................... 2007-300460

(51) Int. Cl.
*H01L 29/20* (2006.01)

(52) U.S. Cl.
USPC .................. 257/615; 257/200; 257/E21.098

(58) Field of Classification Search
USPC .......... 257/189, 200, 201, E21.097, E21.098, 257/76, 615, E29.005, E29.106, E29.108, 257/E21.125, E21.127; 438/22, 48; 117/2
See application file for complete search history.

(56) References Cited

U.S. PATENT DOCUMENTS

| | | | |
|---|---|---|---|
| 5,468,678 A * | 11/1995 | Nakamura et al. | 438/509 |
| 6,413,627 B1 | 7/2002 | Motoki et al. | |
| 6,429,465 B1 | 8/2002 | Yagi et al. | |
| 6,475,627 B1 * | 11/2002 | Ose | 428/446 |
| 6,835,947 B2 * | 12/2004 | Govyadinov et al. | 257/10 |
| 7,541,663 B2 * | 6/2009 | Kusaba et al. | 257/610 |
| 7,615,391 B2 * | 11/2009 | Ojima et al. | 438/42 |
| 2002/0045340 A1 | 4/2002 | Iyechika et al. | |
| 2002/0127783 A1 * | 9/2002 | Otsuki et al. | 438/138 |

(Continued)

FOREIGN PATENT DOCUMENTS

| | | |
|---|---|---|
| CN | 1960014 A | 5/2007 |
| EP | 1 088 914 A1 | 4/2001 |

(Continued)

OTHER PUBLICATIONS

K.H. Baik et al. "Design and Fabrication of GaN High Power Rectifiers", Optoelectronic Devices: III-Nitrides, 2004, pp. 323-350, Chapter 12.

(Continued)

*Primary Examiner* — Cuong Q Nguyen
*Assistant Examiner* — Yosef Gebreyesus
(74) *Attorney, Agent, or Firm* — Drinker Biddle & Reath LLP

(57) ABSTRACT

A group III nitride semiconductor crystal substrate has a diameter of at least 25 mm and not more than 160 mm. The resistivity of the group III nitride semiconductor crystal substrate is at least $1 \times 10^{-4}$ Ω·cm and not more than 0.1 Ω·cm. The resistivity distribution in the diameter direction of the group III nitride semiconductor crystal is at least −30% and not more than 30%. The resistivity distribution in the thickness direction of the group III nitride semiconductor crystal is at least −16% and not more than 16%.

12 Claims, 9 Drawing Sheets

(56) References Cited

U.S. PATENT DOCUMENTS

| | | |
|---|---|---|
| 2005/0009221 A1 | 1/2005 | Miyoshi et al. |
| 2005/0018017 A1* | 1/2005 | Silverbrook ............ 347/54 |
| 2005/0029544 A1* | 2/2005 | Govyadinov et al. ...... 257/197 |
| 2005/0048685 A1 | 3/2005 | Shibata |
| 2005/0179045 A1 | 8/2005 | Ryu et al. |
| 2005/0284359 A1* | 12/2005 | Hotta et al. ............ 117/3 |
| 2006/0063361 A1 | 3/2006 | Kumar et al. |
| 2006/0094145 A1* | 5/2006 | Otsuka et al. ........... 438/31 |
| 2006/0226414 A1 | 10/2006 | Oshima |
| 2006/0278891 A1* | 12/2006 | Saxler et al. ........... 257/192 |
| 2007/0012943 A1* | 1/2007 | Okahisa et al. .......... 257/102 |
| 2007/0051969 A1 | 3/2007 | Oshima et al. |
| 2007/0096147 A1* | 5/2007 | Oshima ................ 257/189 |
| 2007/0158785 A1 | 7/2007 | D'Evelyn et al. |
| 2007/0215982 A1* | 9/2007 | Koukitu et al. .......... 257/607 |
| 2007/0257334 A1 | 11/2007 | Leibiger et al. |
| 2007/0269966 A1 | 11/2007 | Suvorov |
| 2008/0252691 A9* | 10/2008 | Silverbrook ............ 347/54 |
| 2009/0117717 A1* | 5/2009 | Tomasini et al. ......... 438/488 |
| 2009/0127663 A1* | 5/2009 | Okahisa et al. .......... 257/615 |
| 2009/0127664 A1 | 5/2009 | Okahisa et al. |

FOREIGN PATENT DOCUMENTS

| | | |
|---|---|---|
| JP | 3-79769 A | 4/1991 |
| JP | 3-79770 A | 4/1991 |
| JP | 03-252175 | 11/1991 |
| JP | 2000-091234 | 3/2000 |
| JP | 2001-102307 | 4/2001 |
| JP | 2003-017420 | 1/2003 |
| JP | 2005-101475 | 4/2005 |
| JP | 2005-223243 | 8/2005 |
| JP | 2006-193348 | 7/2006 |
| JP | 2007-519591 | 7/2007 |
| JP | 2007-277077 A | 10/2007 |
| JP | 2009-126721 | 6/2009 |
| JP | 2009-126723 | 6/2009 |
| TW | 200507112 A | 2/2005 |
| WO | 2005/050709 | 6/2005 |

OTHER PUBLICATIONS

M. Deschler et al., "Efficient and Uniform Production of III-Nitride Films by Multiwafer MOVPE", Materials Science and Engineering B: vol. 50, 1997, pp. 1-7.

"GaN Wafers—Product Specification" CREE—GAN Wafers Products, Aug. 26, 2005, pp. 1-2.

Foundation for Research and Development Association for Future Electron Devices Study on Commission Technical Investigation Report (Summary) Related to GaN Power Crystal Material Device, Japan, Asahi Research Center Company Limited, Mar. 30, 2007, pp. 9-17 (with partial English-language translation attached).

Chan, J.S., et al., "Thermal Annealing Characteristics of Si and Mg-Implanted GaN Thin Films," Applied Physics Letters, AIP, American Institute of Physics, Melville, NY, U.S., vol. 68, No. 19, May 6, 1996, pp. 2702-2704.

* cited by examiner

GROUP III NITRIDE SEMICONDUCTOR CRYSTAL SUBSTRATE AND SEMICONDUCTOR DEVICE

BACKGROUND OF THE INVENTION

1. Field of the Invention

The present invention relates to a group III nitride semiconductor crystal substrate and a semiconductor device.

2. Description of the Background Art

Gallium nitride (GaN) type semiconductor materials are known to have superior properties such as a large bandgap that is approximately 3 times that of silicon (Si), a high breakdown electric field that is approximately 10 times that of silicon, and also a high saturation electron velocity. Research and development of the gallium nitride type semiconductor material for use in devices of high frequency and high power output in the field of radio communication are actively in progress, and has already come to the stage of practical use in devices directed to base stations for cellular phones. Moreover, the expectation of covering the two competing demands of high breakdown voltage and low loss, i.e. low ON-state resistance, that was difficult in conventional Si power devices, has attracted attention in the application to power devices. Since the logic value of the ON-resistance is inversely proportional to the breakdown electric field raised to the power of three, it may be possible to significantly reduce the ON-resistance in a power device based on gallium nitride to approximately $1/1000$ that of a device based on silicon. Thus, group III nitride semiconductor crystals such as gallium nitride crystals stand out to be a promising material for optical devices such as an LED (Light Emitting Diode) and for electronic devices such as a transistor.

With regards to such group III nitride semiconductor crystals, Japanese Patent Laying-Open No. 2006-193348 (Patent Document 1) discloses a group III nitride semiconductor substrate having a specific resistance of at least $1 \times 10^4$ Ω·cm. In a fabrication method of the group III nitride semiconductor substrate, vapor phase growth such as HVPE (Hydride Vapor Phase Epitaxy), MOCVD (Metal Organic Chemical Vapor Deposition), or MBE (Molecular Beam Epitaxy) is employed to grow epitaxially a group III nitride semiconductor employing dichlorosilane ($SiH_2Cl_2$) and tetrachlorosilane ($SiCl_4$: silicon tetrachloride) for the doping raw material of silicon (Si) qualified as the impurity element.

Japanese National Patent Publication No. 2007-519591 (Patent Document 2) discloses a monocrystalline gallium nitride that has an average density of less than $1 \times 10^6$ cm$^{-2}$ and a dislocation density standard deviation ratio of less than 25%. In the fabrication method thereof, silane ($SiH_4$) and the like are employed as the doping raw material of silicon.

Further, Japanese Patent Laying-Open No. 2005-101475 (Patent Document 3) discloses a III-V group nitride type semiconductor substrate characterized in that the carrier concentration distribution at the outermost surface of the substrate is substantially uniform. In a fabrication method thereof, dichlorosilane is employed as the doping raw material in HVPE.

When a group III nitride semiconductor crystal is to be grown by vapor phase growth such as HVPE, MOCVD or MBE, the concentration of n type impurities (dopant) in the group III nitride semiconductor crystal must be controlled in order to regulate the n type conductive property of the group III nitride semiconductor crystal. Silane and dichlorosilane employed as the doping gas in the aforementioned Patent Documents 1-3 to dope silicon qualified as the n type impurity may be decomposed before arriving at the underlying substrate and adhere to the reaction tube at the growth temperature of the group III nitride semiconductor crystal.

The doping gas employed in the aforementioned Patent Documents 1-3 may react with nitrogen gas or ammonia gas to generate an $Si_xN_y$ (silicon nitride) type compound (x and y are arbitrary integers).

It was difficult to control the concentration of silicon in the doping gas if the doping gas directed to supplying silicon was decomposed or caused reaction prior to arriving at the underlying substrate. As a result, the concentration of silicon taken into the group III nitride semiconductor crystal will vary, disallowing adjustment of the concentration of silicon taken into the group III nitride semiconductor crystal. Therefore, it was difficult to control the resistivity of the group III nitride semiconductor crystal with silicon as a dopant. Particularly, this problem was further noticeable when HVPE was employed since the decomposition of the doping gas and/or reaction with another gas was significant due to the entire heating of the reaction tube.

A possible consideration is to supply the doping gas at high rate for the purpose of preventing thermal decomposition of the doping gas or reaction with the raw material gas. However, the concentration distribution of the doping gas supplied to the underlying substrate will be degraded if the doping gas is supplied at high rate, leading to significant degradation in the in-plane distribution of the resistivity in the group III nitride semiconductor crystal.

Thus, there was a problem that the property such as the ON-resistance is degraded in the case where the resistivity is not regulated and a semiconductor device is fabricated employing a group III nitride semiconductor crystal substrate of high resistivity.

Further, in the case where a semiconductor device is fabricated employing a group III nitride semiconductor crystal substrate having poor resistivity in-plane distribution, the yield was degraded since the property such as the ON-resistance of the semiconductor device will vary.

SUMMARY OF THE INVENTION

In view of the foregoing, an object of the present invention is to provide a group III nitride semiconductor crystal substrate, allowing the resistivity to be reduced and preventing degradation in the resistivity in-plane distribution.

Another object of the present invention is to provide a semiconductor device that can have degradation in properties prevented and the yield improved.

As a result of diligent research on the doping conditions of silicon, the inventors found that, by employing silicon tetrafluoride gas as the doping gas, or by setting the growth rate of a group III nitride semiconductor crystal substrate to at least 200 μm/h and not more than 2000 μm/h based on the usage of silicon tetrachloride gas as the doping gas, decomposition of the doping gas can be prevented and reaction per se of the doping gas with another gas can be suppressed or the effect of the reaction reduced, at the stage of doping silicon. Thus, there was obtained a group III nitride semiconductor crystal substrate allowing the resistivity to be reduced by readily controlling the resistivity and preventing degradation in the resistivity in-plane distribution.

Specifically, the group III nitride semiconductor crystal substrate of the present invention is directed to a group III nitride semiconductor crystal substrate having a diameter of at least 25 mm and not more than 160 mm. The resistivity of the group III nitride semiconductor crystal substrate is at least $1 \times 10^{-4}$ Ω·cm and not more than 0.1 Ω·cm. The resistivity distribution in the diameter direction of the group III nitride semiconductor crystal substrate is at least −30% and not more than 30%. The resistivity distribution in the thickness direction of the group III nitride semiconductor crystal substrate is at least −16% and not more than 16%.

By virtue of the resistivity being not more than 0.1 Ω·cm, the group III nitride semiconductor crystal substrate of the present invention can be conveniently selected as an n type substrate employed in semiconductor devices such as an electronic device or light-emitting device, improved in properties such as low ON-resistance and high breakdown voltage. Further, since it is not necessary to dope silicon in high concentration by virtue of the resistivity being at least $1\times10^{-4}$ Ω·cm, generation of a pit or defect as well as a crack can be suppressed during growth of the group III nitride semiconductor crystal. In the case where the resistivity distribution in the diameter direction is at least −30% and not more than 30% and the resistivity distribution in the thickness direction is at least −16% and not more than 16% in the group III nitride semiconductor crystal substrate, variation in properties can be suppressed, when semiconductor devices are produced using the group III nitride semiconductor crystal substrate. Thus, the yield can be improved.

In the case where the diameter is at least 25 mm, generation at a plane orientation different from the growing plane can be suppressed. Therefore, a group III nitride semiconductor crystal substrate of favorable crystallinity can be obtained. Since an underlying substrate having a diameter of not more than 160 mm is readily available, a nitride semiconductor crystal substrate having a diameter of not more than 160 mm can be obtained readily.

Preferably in the group III nitride semiconductor crystal substrate set forth above, the resistivity distribution in the diameter direction is at least −20% and not more than 20%, and the resistivity distribution in the thickness direction is at least −10% and not more than 10%.

Since the variation in properties, when semiconductor devices are produced using the group III nitride semiconductor crystal substrate, can be further suppressed, the yield can be further improved.

Preferably in the group III nitride semiconductor crystal substrate set forth above, the thickness is at least 2 mm and not more than 160 mm.

In the case where the thickness is at least 2 mm, a plurality of group III nitride semiconductor crystal substrates having a desired thickness can be obtained by slicing the group III nitride semiconductor crystal substrate at the required thickness. In the case where the thickness is not more than 160 mm, a group III nitride semiconductor crystal substrate can be grown readily in terms of facilities. Therefore, the cost can be reduced.

The group III nitride semiconductor crystal substrate set forth above preferably has a thickness of at least 100 μm and not more than 1000 μm.

In the case where the thickness is at least 100 μm, a group III nitride semiconductor crystal substrate having generation of a crack during handling suppressed can be obtained. In the case where the thickness is not more than 1000 μm, the substrate is conveniently employed for a semiconductor device. Thus, the fabrication cost per one group III nitride semiconductor crystal substrate can be reduced.

The group III nitride semiconductor crystal substrate preferably has a resistivity of at least $1\times10^{-3}$ Ω·cm and not more than $8\times10^{-3}$ Ω·cm.

In the case where the resistivity is at least $1\times10^{-3}$ Ω·cm, it is not necessary to dope silicon in high concentration. Therefore, generation of a pit or defect as well as a crack during growth of the group III nitride semiconductor crystal can be suppressed. In the case where the resistivity is not more than $8\times10^{-3}$ Ω·cm, the substrate can be conveniently selected as an n type substrate used in semiconductor devices such as an electronic device or light-emitting device.

In the group III nitride semiconductor crystal substrate set forth above, the concentration of silicon is at least $5\times10^{16}$ $cm^{-3}$ and not more than $5\times10^{20}$ $cm^{-3}$, more preferably at least $3\times10^{18}$ $cm^{-3}$ and not more than $5\times10^{19}$ $cm^{-3}$.

In the case where the concentration of silicon is at least $5\times10^{16}$ $cm^{-3}$, the concentration of silicon taken in can be controlled readily. In the case where the concentration of silicon is at least $3\times10^{18}$ $cm^{-3}$, the concentration of silicon taken in can be controlled more readily. In the case where the silicon concentration is not more than $5\times10^{20}$ $cm^{-3}$, generation of a pit or defect as well as a crack during growth of a group III nitride semiconductor crystal can be suppressed. In the case where the silicon concentration is not more than $5\times10^{19}$ $cm^{-3}$, a group III nitride semiconductor crystal substrate of favorable crystallinity can be obtained.

The group III nitride semiconductor crystal substrate set forth above preferably has a dislocation density of not more than $1\times10^{7}$ $cm^{-2}$.

By employing the group III nitride semiconductor crystal substrate in a semiconductor device such as an electronic device or light-emitting device, properties such as the electric property and optical property can be stabilized.

Preferably in the group III nitride semiconductor crystal substrate set forth above, the main face has an angle of at least −5 degrees and not more than 5 degrees relative to any one of a (0001) plane, (1-100) plane, (11-20) plane and (11-22) plane.

Accordingly, a group III nitride semiconductor crystal of favorable crystallinity can be further grown on the main face. Thus, a semiconductor device of more favorable property can be obtained.

Preferably in the group III nitride semiconductor crystal substrate set forth above, the full width at half maximum (FWHM) of the rocking curve in X-ray diffraction is at least 10 arcsec and not more than 500 arcsec.

Accordingly, a group III nitride semiconductor crystal of favorable crystallinity can be additionally grown on the group III nitride semiconductor crystal substrate. Therefore, a semiconductor device of more favorable property can be obtained.

Preferably, the group III nitride semiconductor crystal substrate set forth above is formed of an $Al_xIn_yGa_{(1-x-y)}N$ ($0\le x\le 1$, $0\le y\le 1$, $x+y\le 1$) crystal. Preferably, the group III nitride semiconductor crystal substrate set forth above is formed of a gallium nitride crystal.

Accordingly, an extremely effective group III nitride semiconductor crystal can be grown.

A semiconductor device of the present invention includes any of the group III nitride semiconductor crystal substrate set forth above, and an epitaxial layer formed on the group III nitride semiconductor crystal substrate.

According to the semiconductor device of the present invention, the group III nitride semiconductor crystal substrate having the resistivity in-plane distribution suppressed is employed, allowing variation in properties to be suppressed. Therefore, the yield can be improved. Further, since the group III nitride semiconductor crystal substrate having low resistivity is employed, degradation in properties such as low ON-resistance and high breakdown voltage can be prevented.

In the present invention, "group III" implies group IIIB in the former IUPAC (The International Union of Pure and Applied Chemistry) system. Namely, a group III nitride semiconductor crystal implies a semiconductor crystal including nitrogen, and at least one element of boron (B), aluminium (Al), gallium (Ga), indium (In) and thallium (Tl). Further, "doping gas" implies gas used to dope impurities (dopant).

According to the group III nitride semiconductor crystal substrate of the present invention, the resistivity can be reduced, and degradation in the resistivity in-plane distribution can be prevented.

Further, according to the semiconductor device of the present invention, degradation in properties can be prevented, and the yield improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
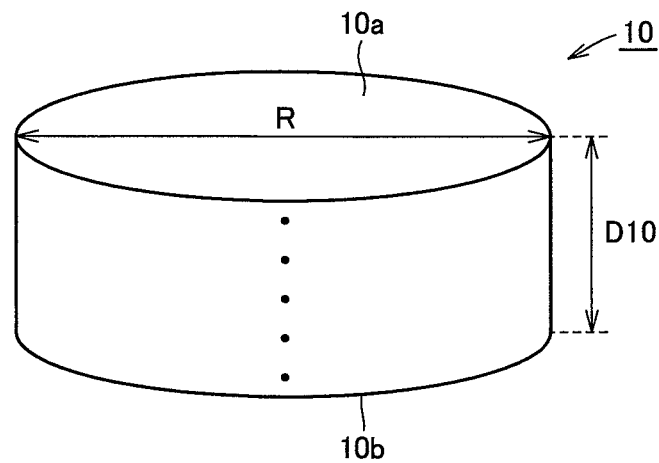
FIG. 1 is a schematic perspective view of a gallium nitride crystal substrate according to a first embodiment of the present invention.

Embodiments of the present invention will be described hereinafter with reference to the drawings. In the drawings, the same or corresponding elements have the same reference characters allotted, and description thereof will not be repeated.

First Embodiment

Figure 2:
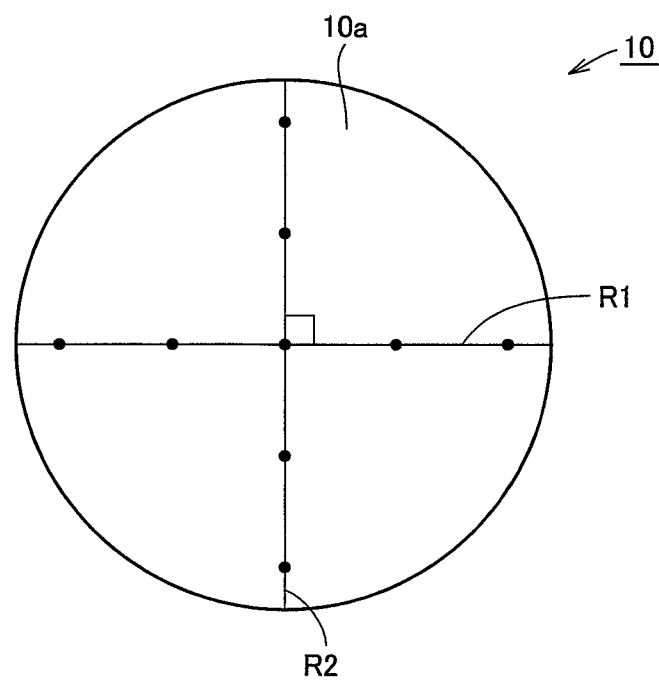
FIG. 2 is a schematic top view of a gallium nitride crystal substrate of the first embodiment.

A group III nitride semiconductor crystal substrate according to an embodiment of the present invention will be described hereinafter with reference to FIGS. 1 and 2. As shown in FIGS. 1 and 2, a group III nitride semiconductor crystal substrate 10 is formed of a group III nitride semiconductor crystal 12 (refer to FIG. 4) having silicon doped as the impurity. Group III nitride semiconductor crystal substrate 10 includes a main face 10a.

As shown in FIGS. 1 and 2, a group III nitride semiconductor crystal substrate 10 of the present embodiment has a diameter R that is at least 25 mm and not more than 160 mm, preferably at least 45 mm and not more than 130 mm. A diameter R of at least 25 mm is advantageous in that the crystallinity of group III nitride semiconductor crystal substrate 10 is rendered favorable since the occurrence of a different plane orientation at main face 10a is prevented. In the case where diameter R is at least 45 mm, the crystallinity of group III nitride semiconductor crystal substrate 10 is rendered more favorable. A diameter R of 160 mm is advantageous in that the cost can be reduced since the underlying substrate is readily available. In the case where diameter R is not more than 130 mm, the cost can be further reduced.

Group III nitride semiconductor crystal substrate 10 has a thickness D10 of at least 2 mm and not more than 160 mm, preferably at least 6 mm and not more than 50 mm. In the case where D10 is at least 2 mm, a plurality of group III nitride semiconductor crystal substrates having a desired thickness can be obtained by slicing group III nitride semiconductor crystal substrate 10 to the desired thickness. A thickness D10 of at least 6 mm is advantageous in that more group III nitride semiconductor crystal substrates of a desired thickness can be obtained from one group III nitride semiconductor crystal substrate 10, leading to reduction in cost. In the case where thickness D10 is not more than 160 mm, a group III nitride semiconductor crystal can be grown readily in terms of facilities. Therefore, the cost can be reduced. In the case where thickness D10 is at least 50 mm, the cost can be further reduced.

The resistivity of group III nitride semiconductor crystal substrate 10 is at least $1\times10^{-4}$ Ω·cm and not more than 0.1 Ω·cm, preferably at least $1\times10^{-3}$ Ω·cm and not more than $1\times10^{-2}$ Ω·cm, more preferably at least $1\times10^{-3}$ Ω·cm and not more than $8\times10^{-3}$ Ω·cm. The resistivity of at least $1\times10^{-4}$ Ω·cm is at advantageous in that silicon does not have to be doped in high concentration. Therefore, the generation of a pit or defect, as well as a crack during growth of a group III nitride semiconductor crystal can be suppressed. In the case where the resistivity is at least $1\times10^{-3}$ Ω·cm, the generation of a pit, defect, and crack can be further suppressed. In the case where the resistivity is not more than 0.1 Ω·cm, the substrate is conveniently employed in light-emitting devices and electronic devices. In the case where the resistivity is not more than $1\times10^{-2}$ Ω·cm, the substrate is conveniently selected as an n type substrate used in light-emitting devices and optical devices, particularly power devices. In the case where the resistivity is not more than $8\times10^{-3}$ Ω·cm, the substrate is further conveniently selected as an n type substrate used in light-emitting devices and optical devices, particularly power devices.

As used herein, "resistivity" is a value measured by the method set forth below. First, main face 10a of group III nitride semiconductor crystal substrate 10 is subjected to polishing and dry etching. Then, the resistivity is measured at each site of the total of 9 points such as the nine dots shown in FIG. 2, i.e. 5 points along an arbitrary diameter R1 including one point around the center, two points around either ends, and respective intermediate points between the center and either end (two points), and 4 points along a diameter R2 orthogonal to diameter R1, including two points around either ends and respective intermediate points between the center and either end (two points), by the four probe method at room temperature. Then, the average value of the resistivity at these nine points is calculated. Although a method of measuring the resistivity with respect to main face 10a has been described, the resistivity may be measured for another face. For example, a face parallel to main face 10a is obtained by slicing substantially the middle plane in the thickness direction between main face 10a and a face 10b opposite surface to main face 10a. Then, the resistivity at the nine points on the obtained face is measured in a similar manner, from which the resistivity average value can be calculated. Alternatively, the resistivity of nine points on a face orthogonal to main face 10a may be measured, from which the resistivity average value can be calculated.

The resistivity distribution in the diameter direction of group III nitride semiconductor crystal substrate 10 is at least −30% and not more than 30%, preferably at least −20% and not more than 20%, and more preferably at least −17% and not more than 17%. The range of −30% to 30% is advantageous in that, when semiconductor devices are produced using group III nitride semiconductor crystal substrate 10, variation of the performance in the diameter direction is suppressed and the yield improved. The range of −20% to 20% is advantageous in that, when semiconductor devices are produced, variation of the performance is suppressed and the yield improved. The range of −17% to 17% is advantageous in that, when semiconductor devices are produced, variation of the performance is further suppressed and the yield further improved.

As used herein, "resistivity distribution in the diameter direction" refers to a value measured by a method set forth below. First, main face 10a of group III nitride semiconductor crystal substrate 10 is subjected to polishing and dry etching. Then, the resistivity is measured at each site of the total of 9 points such as the nine dots shown in FIG. 2, i.e. 5 points along an arbitrary diameter R1 including one point around the center, two points around either ends, and respective intermediate points between the center and either end (two points), and 4 points along a diameter R2 orthogonal to diameter R1, including two points around either ends and respective intermediate points between the center and either end (two points), by the four probe method at room temperature. Then, the average value of the resistivity at these nine points is calculated. With regards to the values of resistivity at the nine points, the value defined by (largest value−average value)/average value is taken as the upper limit of the resistivity distribution in the diameter direction, and the value defined by (smallest value−average value)/average value is taken as the lower limit of the resistivity distribution in the diameter direction. Although a method of measuring the resistivity with respect to main face 10a has been described, the resistivity may be measured for another face.

The resistivity distribution in the thickness direction of group III nitride semiconductor crystal substrate 10 is at least −16% and not more than 16%, preferably at least −10% and not more than 10%, more preferably at least −9% and not more than 9%. The range of −16% to 16% is advantageous in that, when semiconductor devices are produced using this group III nitride semiconductor crystal substrate, variation of the performance in the thickness direction can be suppressed and the yield improved. The range of −10% to 10% is advantageous in that, when semiconductor devices are produced, variation of the performance can be suppressed and the yield improved. The range of −9% to 9% is advantageous in that, when semiconductor devices are produced, variation of the performance is further suppressed and the yield further improved.

As used herein, "resistivity distribution in the thickness direction" refers to a value measured by a method set forth below. First, main face 10a of group III nitride semiconductor crystal substrate 10 is subjected to polishing and dry etching. Then, the resistivity is measured at each site of the total of 5 points at respective arbitrary thickness such as the five dots shown in FIG. 1, i.e. one point in the proximity of main face 10a, one point in the proximity of a face 10b opposite to main face 10a, and 3 points between main face 10a and opposite face 10b, by the four probe method at room temperature. The average of the 5 values of resistivity is calculated. With regards to the values of resistivity at the five points, the value defined by (largest value−average value)/average value is taken as the upper limit of the resistivity distribution in the thickness direction, and the value defined by (smallest value−average value)/average value is taken as the lower limit of the resistivity distribution in the thickness direction.

The concentration of silicon in group III nitride semiconductor crystal 12 is preferably at least $5\times10^{16}$ cm$^{-3}$ and not more than $5\times10^{20}$ cm$^{-3}$, more preferably at least $3\times10^{18}$ cm$^{-3}$ and not more than $5\times10^{19}$ cm$^{-3}$. In the case where the silicon concentration is at least $5\times10^{16}$ cm$^{-3}$, the concentration of the silicon taken in can be readily controlled since silicon is introduced effectively. Therefore, a group III nitride semiconductor crystal substrate 10 containing silicon of high concentration can be obtained. In the case where the silicon concentration is at least $3\times10^{18}$ cm$^{-3}$, the concentration of silicon taken in can be controlled more readily. In the case where the silicon concentration is not more than $5\times10^{20}$ cm$^{-3}$, generation of a pit or defect as well as a crack during growth of a group III nitride semiconductor crystal can be suppressed. In the case where the silicon concentration is not more than $5\times10^{19}$ cm$^{-3}$, the crystallinity is rendered further favorable.

As used herein, "silicon concentration" refers to a value measured by a method set forth below. First, main face 10a of group III nitride semiconductor crystal substrate 10 is subjected to polishing and dry etching. Then, the silicon concentration is measured at each site of the total of 9 points such as the nine dots shown in FIG. 2, i.e. 5 points along an arbitrary diameter R1 including one point around the center, two points around either ends, and respective intermediate points between the center and either end (two points), and 4 points along a diameter R2 orthogonal to diameter R1, including two points around either ends and respective intermediate points between the center and either end (two points), by SIMS (Secondary Ion-microprobe Mass Spectrometer) at room temperature. Then, the average value of the silicon concentration at the nine points is calculated. Although a method of measuring the silicon concentration with respect to main face 10a has been described, the silicon concentration may be measured at nine points in another face, or at arbitrary 9 points based on a combination of two or more faces.

The dislocation density of group III nitride semiconductor crystal substrate 10 is preferably not more than $1 \times 10^7$ cm$^{-2}$, more preferably not more than $1 \times 10^6$ cm$^{-2}$. A dislocation density of not more than $1 \times 10^7$ cm$^{-2}$ is advantageous in that, when group III nitride semiconductor crystal substrate 10 is employed in an electronic device, the electric property can be improved, and when group III nitride semiconductor crystal substrate 10 is employed in an optical device, the optical property can be improved. A semiconductor device of more favorable property can be obtained. In the case where the dislocation density is not more than $1 \times 10^6$ cm$^{-2}$, the performance in usage of a semiconductor device can be further improved. Although the dislocation density is preferably as low as possible, the lower limit is, for example, at least $1 \times 10^3$ cm$^{-2}$. In the case where the dislocation density is at least $1 \times 10^3$ cm$^{-2}$, group III nitride semiconductor crystal substrate 10 can be produced at low cost.

As used herein, "dislocation density" is the etch pit density obtained from the number of etch pits counted on an etched surface of the nitride semiconductor crystal that has been immersed in a KOH—NaOH (potassium hydroxide-sodium hydroxide) mixture melt of 350° C., using the Nomarski microscope or a scanning electron microscope (SEM).

The concentration of oxygen in group III nitride semiconductor crystal substrate 10 is not more than $5 \times 10^{16}$ cm$^{-3}$, preferably not more than $2 \times 10^{16}$ cm$^{-3}$. Although gas containing oxygen is not employed as doping gas in the present embodiment, the oxygen in the reaction tube will be taken into the growing group III nitride semiconductor crystal as a dopant. Although oxygen is an n type dopant, identical to silicon, the efficiency of being taken into the c-plane is poor. Particularly, the introduction efficiency differs depending upon the plane orientation. Oxygen is known to have poor controllability as an n type dopant. By preventing the introduction of oxygen down to the concentration of not more than $5 \times 10^{16}$ cm$^{-3}$, silicon will become dominant in terms of the n type carrier concentration. Therefore, control over the silicon concentration allows the carrier concentration of group III nitride semiconductor crystal 12 to be controlled. The crystallinity can be rendered further favorable by setting the oxygen concentration to preferably not more than $2 \times 10^{16}$ cm$^{-3}$. Although the oxygen concentration is preferably as low as possible, the lower limit is $5 \times 10^{15}$ cm$^{-3}$ or above in consideration of the lowest measurable level for detection in SIMS analysis.

Main face 10a of group III nitride semiconductor crystal substrate 10 is preferably at the angle of at least −5 degrees and not more than 5 degrees relative to any one of a (0001) plane, (1-100) plane, (11-20) plane and (11-22) plane. A group III nitride semiconductor crystal of favorable crystallinity can be additionally grown on such a main face 10a. Therefore, the usage thereof in an electronic device and a light-emitting device allows improvement in the electric property and optical property, respectively. A semiconductor device of further favorable property can be obtained.

Each individual plane is represented by ( ). Moreover, although it is crystallographically defined to attach "–" (bar sign) above the numeral for a negative index, the negative sign is attached in front of a numeral in the present specification.

The full width at half maximum of the rocking curve in the X-ray diffraction of group III nitride semiconductor crystal substrate 10 is preferably at least 10 arcsec and not more than 500 arcsec, preferably at least 20 arcsec and not more than 100 arcsec. The value of not more than 500 arcsec is advantageous in that a semiconductor device of further favorable property is obtained since a group III nitride semiconductor crystal of favorable crystallinity can be further grown on main face 10a of group III nitride semiconductor crystal substrate 10. In the case where the value is not more than 100 arcsec, a group III nitride semiconductor crystal of further favorable crystallinity can be additionally grown on main face 10a. In the case where the value is at least 10 arcsec, the cost can be reduced since a group III nitride semiconductor crystal constituting group III nitride semiconductor crystal substrate 10 can be readily grown. The cost can be further reduced in the case where the value is at least 20 arcsec.

As used herein, "full width at half maximum of a rocking curve" implies a measured value of the full width at half maximum of a rocking curve at the (0004) plane by XRD (X-ray diffraction), and becomes an index representing the in-plane orientation. The lower value of the full width at half maximum of a rocking curve, the higher favorable crystallinity.

The group III nitride semiconductor crystal constituting a group III nitride semiconductor crystal substrate 10 is preferably an $Al_xIn_yGa_{(1-x-y)}N$ ($0 \leq x \leq 1$, $0 \leq y \leq 1$, $x+y \leq 1$) crystal, more preferably a gallium nitride crystal.

A fabrication method of a group III nitride semiconductor crystal substrate of the present embodiment will be described with reference to FIGS. 3 and 4. First, a growing method of a group III nitride semiconductor crystal constituting a group III nitride semiconductor crystal substrate will be described.

Figure 3:
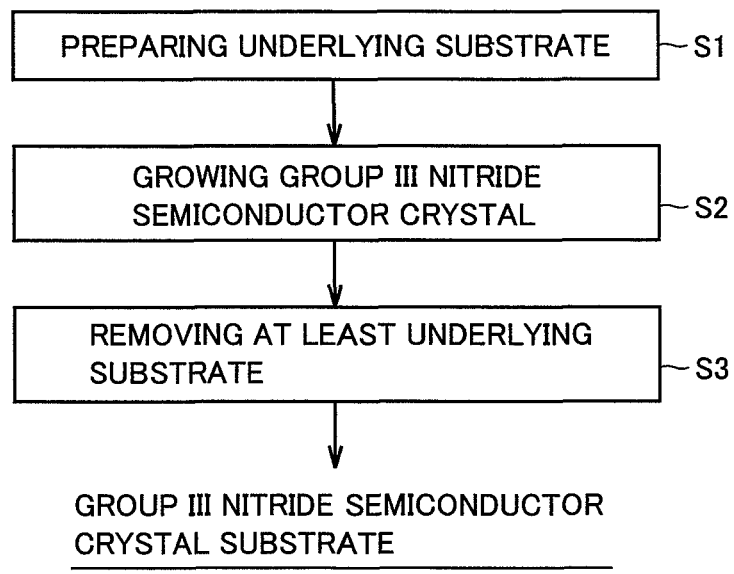
FIG. 3 is a flowchart of a fabrication method of a group III nitride semiconductor crystal substrate of the first embodiment.
Figure 4:
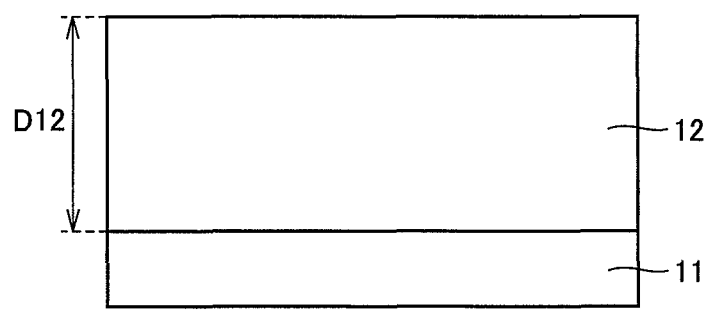
FIG. 4 is a schematic view representing a state of growing a group III nitride semiconductor crystal in the first embodiment.

As shown in FIGS. 3 and 4, an underlying substrate 11 is prepared (step S1). Underlying substrate 11 is a substrate directed to growing group III nitride semiconductor crystal 12 thereon.

At the preparing step (step S1), underlying substrate 11 preferably formed of a material including at least one type selected from the group consisting of silicon (Si), sapphire ($Al_2O_3$), gallium arsenide (GaAs), silicon carbide (SiC), gallium nitride (GaN), and aluminium nitride (AlN) is prepared. Alternatively, a spinel type crystal substrate such as $MgAl_2O_4$ is preferably prepared as underlying substrate 11. Moreover, in order to reduce the difference in lattice constant, underlying substrate 11 is preferably formed of a composition identical to that of group III nitride semiconductor crystal 12 to be grown. For a gallium nitride substrate, the monocrystalline gallium nitride substrate disclosed in Japanese Patent Laying-Open No. 2001-102307, for example, can be employed.

The prepared underlying substrate 11 has a diameter of at least 25 mm and not more than 160 mm, preferably at least 45 mm and not more than 130 mm. Underlying substrate 11 having a diameter of at least 25 mm is advantageous in that group III nitride semiconductor crystal 12 of favorable crystallinity can be grown since growing a group III nitride semiconductor crystal 12 constituting group III nitride semiconductor crystal substrate 10 on a plane of a different plane orientation can be prevented. In the case where the diameter of underlying substrate 11 is at least 45 mm, group III nitride semiconductor crystal 12 of further favorable crystallinity can be grown. In the case where the diameter of underlying substrate 11 is not more than 160 mm, the cost can be reduced since it is available readily. In the case where the diameter of underlying substrate 11 is not more than 130 mm, the cost can be further reduced.

Then, a group III nitride semiconductor crystal 12 doped with silicon is grown on underlying substrate 11 by vapor phase growth (step S2). For the doping gas, silicon tetrafluoride gas, for example, may be employed. In the present embodiment, silicon tetrafluoride gas alone is employed for the doping gas.

The growing method is not particularly limited as long as it corresponds to vapor phase growth. For example, HVPE, MOCVD, MBE, or the like can be employed to grow group III nitride semiconductor crystal 12. In the present embodiment, group III nitride semiconductor crystal 12 is grown by HVPE. By virtue of the high crystal growth rate, HVPE is advantageous in that a group III nitride semiconductor crystal 12 of great thickness D12 can be grown by controlling the growing time.

Figure 5:
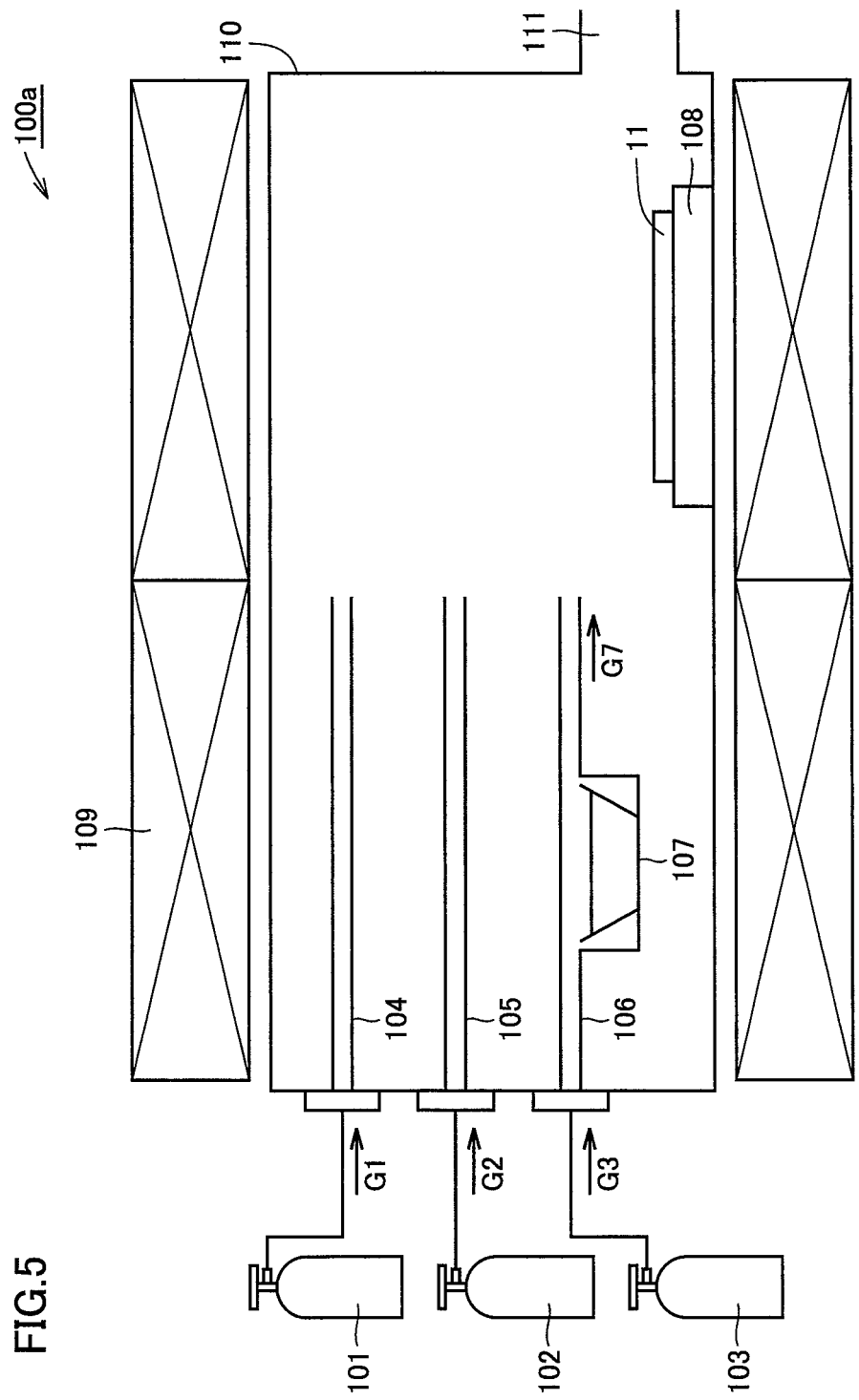
FIG. 5 is a schematic view of an HVPE apparatus employed in a growing method of a group III nitride semiconductor crystal of the first embodiment.

An HVPE apparatus 100*a* employed in the growing method of a group III nitride semiconductor crystal in the present embodiment will be described with reference to FIG. 5. As shown in FIG. 5, HVPE apparatus 100*a* includes a first raw material gas cylinder 101, a doping gas cylinder 102, a second raw material gas cylinder 103, a first gas introduction pipe 104, a doping gas introduction pipe 105, a second gas introduction pipe 106, a source boat 107, a susceptor 108, a heater 109, a reaction tube 110, an exhaust pipe 111, and an exhaust gas treatment device. HVPE apparatus 100*a* is based on a horizontal type reaction tube, for example. Alternatively, HVPE apparatus 100*a* may be a vertical type reaction tube.

Reaction tube 110 is a vessel to hold underlying substrate 11 therein and grow a group III nitride semiconductor crystal on underlying substrate 11. A quartz reaction tube, for example, may be employed for reaction tube 110. Raw material containing an element constituting a group III nitride semiconductor crystal to be grown is supplied to each of first raw material gas cylinder 101, second raw material gas cylinder 103 and source boat 107. Doping gas cylinder 102 is filled with gas containing silicon qualified as the dopant. In the present embodiment, doping gas cylinder 102 is filled with silicon tetrafluoride gas as the doping gas. First gas introduction pipe 104, doping gas introduction pipe 105, and second gas introduction pipe 106 are provided at reaction tube 110 to introduce first raw material gas G1, doping gas G2, and second raw material gas G3, respectively, from outside reaction tube 110. Source boat 107 stores and holds a metal raw material of the group III nitride semiconductor crystal, and is disposed in second gas introduction pipe 106.

Susceptor 108 holds underlying substrate 11. In reaction tube 110, susceptor 108 is disposed such that the face on which underlying substrate 11 is held is located below first gas introduction pipe 104, doping gas introduction pipe 105 and second gas introduction pipe 106. Susceptor 108 is disposed horizontally in reaction tube 110. Alternatively, susceptor 108 may be configured with underlying substrate 11 disposed vertically. HVPE apparatus 100*a* may further include a local heating mechanism such as a resistance heater for underlying substrate 11.

A heater 109 is disposed outside reaction tube 110, capable of heating the entire interior of reaction tube 110 to at least 700° C. and not more than 1500° C., for example. Exhaust pipe 111 is provided at reaction tube 110 to output the gas subsequent to reaction outside of reaction tube 110. The exhaust gas treatment device is configured to allow disposal of the gas subsequent to reaction from exhaust pipe 111 so as to reduce environmental load.

In the growing step (step S2), the prepared underlying substrate 11 is held on susceptor 108, as shown in FIG. 5. At this stage, a plurality of underlying substrates 11 may be held on susceptor 108.

First and second raw material gas cylinders 101 and 103 filled with first and second raw material gasses G1 and G3, respectively, are prepared. In addition, the metal raw material is supplied to source boat 107. First raw material gas G1, second raw material gas G3 and the metal raw material are the raw material for a group III nitride semiconductor crystal 12 to be grown. When group III nitride semiconductor crystal 12 to be grown is gallium nitride, ammonia ($NH_3$) gas, hydrogen chloride (HCl) gas, and gallium (Ga), for example, may be employed for the first raw material gas, second raw material gas, and the metal raw material supplied to source boat 107, respectively. Further, a doping gas cylinder 102 filled with silicon tetrafluoride gas is prepared.

Then, source boat 107 is heated. Reaction gas G7 is generated by the reaction of second raw material gas G3 from second gas introduction pipe 106 with the raw material at source boat 107. First raw material gas G1 from first gas introduction pipe 104, doping gas G2, and reaction gas G7 are delivered (supplied) to strike the surface of underlying substrate 11 for reaction. At this stage, a carrier gas to carry these gases to underlying substrate 11 may be employed. Inert gas such as nitrogen ($N_2$) gas, hydrogen ($H_2$) gas and argon (Ar) gas may be employed for the carrier gas.

According to HVPE, the interior of reaction tube 110 is heated by means of heater 109 to a temperature that allows group III nitride semiconductor crystal 12 to be grown at an appropriate rate. The temperature for growing group III nitride semiconductor crystal 12 is preferably at least 900° C. and not more than 1300° C., more preferably at least 1050° C. and not more than 1200° C. In the case where group III nitride semiconductor crystal 12 is grown at the temperature of 900° C. or higher, generation of a defect at group III nitride semiconductor crystal 12 can be prevented. In addition, development at a plane orientation different from the plane orientation for growth (for example, a pit or the like in the case of a c-plane) can be suppressed. Namely, a group III nitride semiconductor crystal 12 of favorable crystallinity can be grown stably with respect to the plane orientation of growth. In the case where group III nitride semiconductor crystal 12 is grown at the temperature of 1050° C. or higher, the crystallinity can be rendered more favorable. In the case where group III nitride semiconductor crystal 12 is grown at the temperature of 1300° C. or lower, degradation in crystallinity can be suppressed since decomposition of the growing group III nitride semiconductor crystal 12 can be suppressed. In the case where group III nitride semiconductor crystal 12 is grown at the temperature of 1200° C. or lower, degradation in crystallinity can be further suppressed.

The partial pressure of silicon tetrafluoride gas in growing group III nitride semiconductor crystal 12 is preferably at least $2.0 \times 10^{-7}$ atm and not more than $1.0 \times 10^{-5}$ atm. In the case where the partial pressure of silicon tetrafluoride is $2.0 \times 10^{-7}$ atm, silicon qualified as the n type dopant can be taken in group III nitride semiconductor crystal 12 sufficiently. In the case where the partial pressure of silicon tetrafluoride is not more than $1.0 \times 10^{-5}$ atm, silicon can be doped with higher controllability since the generation of an $Si_xN_y$ (silicon nitride) type compound can be further suppressed. In consideration of the concentration of silicon doped into group III nitride semiconductor crystal 12, the partial pressure of silicon tetrafluoride gas is not more than $1.0 \times 10^{-5}$ atm. The total of respective partial pressures (entirety) of each of the raw material gas, carrier gas, doping gas, and the like in reaction tube 110 is 1 atm. The concentration of silicon tetrafluoride gas is proportional to the partial pressure.

By adjusting the flow rate of first raw material gas G1, the flow rate of second raw material gas G3, or the amount of the raw material in source boat 107, the thickness of the group III nitride semiconductor crystal to be grown can be modified appropriately. Group III nitride semiconductor crystal 12 is preferably grown such that the thickness D12 thereof is at least 100 μm and not more than 1100 μm, for example. By virtue of the high crystal growth rate in HVPE, a group III nitride semiconductor crystal 12 having a large thickness can be grown by controlling the growing time. In the case where thickness D12 is at least 100 μm, a group III nitride semiconductor crystal 12 that can be employed singularly as the substrate for various types of semiconductor devices can be grown readily. By setting thickness D12 to not more than 1100 μm, a group III nitride semiconductor crystal substrate 10 having the aforementioned thickness D10 can be obtained by the step of removing at least underlying substrate 11 (step S3) that will be described afterwards.

At the growing step (step S2), the doping gas is supplied to underlying substrate 11 such that the concentration of silicon in group III nitride semiconductor crystal 12 is preferably at least $5 \times 10^{16}$ cm$^{-3}$ and not more than $5 \times 10^{20}$ cm$^{-3}$, more preferably at least $3 \times 10^{18}$ cm$^{-3}$ and not more than $5 \times 10^{19}$ cm$^{-3}$. In the case where the silicon concentration is at least $5 \times 10^{16}$ cm$^{-3}$, the concentration of silicon taken in group III nitride semiconductor crystal 12 can be readily controlled by adjusting the concentration of doping gas G2. In the case where the silicon concentration is at least $3 \times 10^{18}$ cm$^{-3}$, the concentration of silicon taken in group III nitride semiconductor crystal 12 can be controlled more readily. In the case where the silicon concentration is not more than $5 \times 10^{20}$ cm$^{-3}$, generation of a pit or defect, as well as generation of a crack, at group III nitride semiconductor crystal 12 during growth, can be suppressed. In the case where the silicon concentration is not more than $5 \times 10^{19}$ cm$^{-3}$, generation of a pit or defect at group III nitride semiconductor crystal 12, as well as generation of a crack, can be suppressed.

In the growing step (step S2), group III nitride semiconductor crystal 12 is grown such that the resistivity is at least $1 \times 10^{-4}$ Ω·cm and not more than 0.1 Ω·cm, preferably at least $1 \times 10^{-3}$ Ω·cm and not more than $1 \times 10^{-2}$ Ω·cm, more preferably at least $1 \times 10^{-3}$ Ω·cm and not more than $8 \times 10^{-3}$ Ω·cm. In the case where the resistivity is at least $1 \times 10^{-4}$ Ω·cm, silicon does not have to be doped in high concentration. Therefore, the event of group III nitride semiconductor crystal 12 rendered fragile due to impurities being taken in can be suppressed. As a result, a group III nitride semiconductor crystal 12 can be grown having generation of a pit or defect, as well as a crack suppressed. In the case where the resistivity is at least $1 \times 10^{-3}$ Ω·cm, a group III nitride semiconductor crystal 12 further suppressed in the generation of a pit, defect and crack can be grown. In the case where the resistivity is not more than 0.1 Ω·cm, a group III nitride semiconductor crystal 12 that can be conveniently employed for an electronic device or light-emitting device can be grown. In the case where the resistivity is not more than $1 \times 10^{-2}$ Ω·cm, a group III nitride semiconductor crystal 12 conveniently selected for an electronic device or light-emitting device, particularly a power device, can be grown. In the case where the resistivity is not more than $8 \times 10^{-3}$ Ω·cm, a group III nitride semiconductor crystal 12 further conveniently selected for an electronic device or light-emitting device, particularly a power device, can be grown.

In addition, group III nitride semiconductor crystal 12 is grown such that the resistivity distribution in the diameter direction is at least −30% and not more than 30%, preferably at least −20% and not more than 20%, more preferably −17% and not more than 17%. The range of −30% to 30% is advantageous in that, for producing semiconductor devices, there be grown group III nitride semiconductor crystal 12 having variation of the performance in the diameter direction suppressed and the yield improved. The range of −20% to 20% is advantageous in that, when semiconductor devices are produced, variation of the performance can be suppressed and the yield improved. The range of −17% to 17% is advantageous in that, when semiconductor devices are produced, variation of the performance can be further suppressed and the yield further improved.

Group III nitride semiconductor crystal 12 is grown such that the resistivity distribution in the thickness direction is at least −16% and not more than 16%, preferably at least −10% and not more than 10%, more preferably at least −9% and not more than 9%. The range of −16% to 16% is advantageous in that group III nitride semiconductor crystal 12 is grown such that, when used for producing semiconductor devices, variation of the performance in the thickness direction can be suppressed and the yield improved. The range of −10% to 10% is advantageous in that group III nitride semiconductor crystal 12 is grown such that, when used for producing semiconductor devices, variation of the performance in the thickness direction can be suppressed and the yield improved. The range of −9% to 9% is advantageous in that, group III nitride semiconductor crystal 12 is grown such that, when semiconductor devices are produced, variation of the performance is further suppressed and the yield further improved.

Preferably in the growing step (step S2), group III nitride semiconductor crystal 12 is an $Al_xIn_yGa_{(1-x-y)}N$ (0≤x≤1, 0≤y≤1, x+y≤1) crystal, preferably a gallium nitride crystal. Accordingly, an extremely effective group III nitride semiconductor crystal 12 can be grown.

In the growing step (step S2), the doping gas is supplied to underlying substrate 11 such that the concentration of oxygen in group III nitride semiconductor crystal 12 is not more than $5 \times 10^{16}$ cm$^{-3}$. Although gas containing oxygen is not employed as doping gas in the present embodiment, the oxygen in reaction tube 110 will be taken into the growing group III nitride semiconductor crystal 12. Although oxygen is an n type dopant, identical to silicon, the efficiency of being taken into the c-plane is poor. Particularly, the introduction efficiency differs depending upon the plane orientation. Oxygen is known to have poor controllability as an n type dopant. By preventing the introduction of oxygen down to the concentration of not more than $5 \times 10^{16}$ cm$^{-3}$, more preferably down to the concentration of not more than $2 \times 10^{16}$ cm$^{-3}$, the resistivity of group III nitride semiconductor crystal 12 can be controlled stably. Although the oxygen concentration is preferably as low as possible, the lower limit is $5 \times 10^{15}$ cm$^{-3}$ or above in consideration of the lowest measurable level for detection in SIMS analysis.

In the growing step (step S2), group III nitride semiconductor crystal 12 is grown such that the dislocation density of group III nitride semiconductor crystal 12 is preferably not more than $1 \times 10^7$ cm$^{-2}$, more preferably not more than $1 \times 10^6$ cm$^{-2}$. A dislocation density of not more than $1 \times 10^7$ cm$^{-2}$ is advantageous in that, when employed in an electronic device, the electric property can be improved, and when employed in an optical device, the optical property can be improved. A group III nitride semiconductor crystal 12 of more favorable property can be obtained. In the case where the dislocation density is not more than $1 \times 10^6$ cm$^{-2}$, the performance in usage of a semiconductor device can be further improved. Although the dislocation density is preferably as low as possible, the lower limit is, for example, at least $1 \times 10^3$ cm$^{-2}$. In the case where the dislocation density is at least $1 \times 10^3$ cm$^{-2}$, a group III nitride semiconductor crystal 12 can be produced at low cost.

In the growing step (step S2), group III nitride semiconductor crystal 12 is grown such that the main face of group III nitride semiconductor crystal 12 is preferably at the angle of at least −5 degrees and not more than 5 degrees relative to any one of a (0001) plane, (1-100) plane, (11-20) plane and (11-22) plane. A group III nitride semiconductor crystal substrate of favorable crystallinity can be additionally grown on the main face. Therefore, the usage thereof in an electronic device and a light-emitting device allows improvement in the electric property and optical property, respectively. A semiconductor device of further favorable property can be obtained.

In the growing step (step S2), group III nitride semiconductor crystal 12 is grown such that the full width at half maximum of a rocking curve in the X-ray diffraction is preferably at least 10 arcsec and not more than 500 arcsec, more preferably at least 20 arcsec and not more than 100 arcsec. The value of not more than 500 arcsec is advantageous in that a semiconductor device of further favorable property is obtained since a group III nitride semiconductor crystal of favorable crystallinity can be further grown on group III nitride semiconductor crystal 12. In the case where the value is not more than 100 arcsec, a group III nitride semiconductor crystal of further favorable crystallinity can be additionally grown thereon. In the case where the value is at least 10 arcsec, the cost can be reduced since a group III nitride semiconductor crystal 12 can be readily grown. The cost can be further reduced in the case where the value is at least 20 arcsec.

Then, the heating by heater 109 is stopped, and the temperature of source boat 107, group III nitride semiconductor crystal 12, and underlying substrate 11 is reduced down to approximately the room temperature. Then, underlying substrate 11 and group III nitride semiconductor crystal 12 are taken out from reaction tube 10.

Thus, a group III nitride semiconductor crystal 12 can be grown on underlying substrate 11 shown in FIG. 4.

Figure 6:
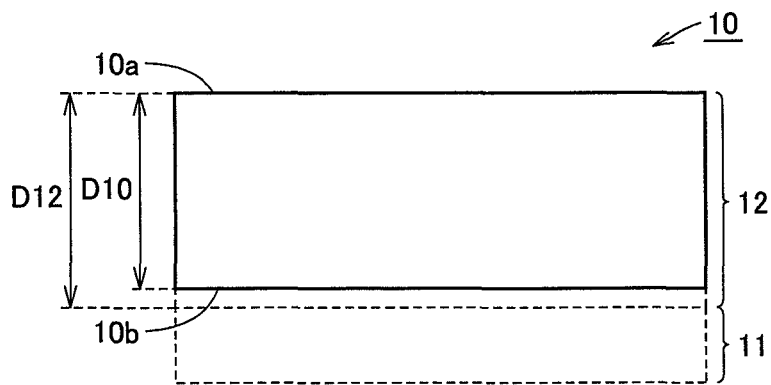
FIG. 6 is a schematic diagram of a group III nitride semiconductor crystal representing a state of at least the underlying substrate removed in the first embodiment.

Referring to FIG. 6, at least underlying substrate 11 is removed to produce a group III nitride semiconductor crystal substrate 10 constituted of group III nitride semiconductor crystal 12 having a thickness D10 of at least 100 μm (step S3).

The crystallinity is often not favorable in the neighborhood of the interface between group III nitride semiconductor crystal 12 and underlying substrate 11. It is therefore preferable to fabricate a group III nitride semiconductor crystal substrate 10 by further removing the region of group III nitride semiconductor crystal 12 where the crystallinity is not favorable. Thus, a group III nitride semiconductor crystal substrate 10 having a main face 10a and a face 10b opposite to main face 10a is produced, as shown in FIG. 6.

The removing method includes the method of, for example, cutting, grinding, and the like. Cutting refers to dividing (slicing) mechanically at least underlying substrate 11 from group III nitride semiconductor crystal 12 by means of a slicer having a peripheral cutting edge of a diamond electrolytic deposited wheel or a wire saw. Grinding refers to mechanically grinding away at least underlying substrate 11 by a grinding equipment with a diamond grindstone.

The face to be removed from group III nitride semiconductor crystal 12 is not limited to a face parallel to the surface of underlying substrate 11. For example, a face having an arbitrary inclination with respect to the surface may be sliced. It is to be noted that main face 10a preferably has an angle of at least −5 degrees and not more than 5 degrees relative to any one of a (0001) plane, (1-100) plane, (11-20) plane and (11-22) plane, as set forth above.

Main face 10a and opposite face 10b of group III nitride semiconductor crystal substrate 10 may be further subjected to polishing or surface treatment. The polishing method or the surface treatment method is not particularly limited, and an arbitrary method may be employed.

By carrying out the steps set forth above (steps S1-S3), a group III nitride semiconductor crystal substrate 10 shown in FIGS. 1 and 2 can be fabricated. Namely, there is obtained a group III nitride semiconductor crystal substrate 10 having a resistivity of at least $1\times10^{-4}$ Ω·cm and not more than 0.1 Ω·cm, a resistivity distribution in the diameter direction of at least −30% and not more than 30%, and a resistivity distribution in the thickness direction of at least −16% and not more than 16%.

First Modification

A fabrication method of a group III nitride semiconductor crystal substrate according to a first modification of the present embodiment will be described hereinafter with reference to FIGS. 7 and 8.

Figure 7:
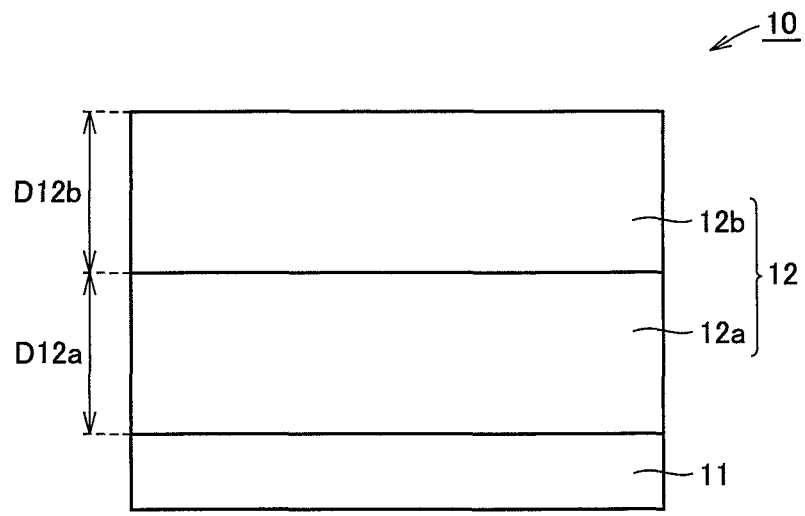
FIG. 7 is a schematic diagram of a grown state of a group III nitride semiconductor crystal according to a first modification of the first embodiment.

As shown in FIG. 7, the growing method of a group III nitride semiconductor crystal substrate of the present modification is basically similar to that of the first embodiment set forth above, and differs in that two layers of group III nitride semiconductor crystal are grown at the growing step (step S2).

Specifically, as shown in FIG. 7, group III nitride semiconductor crystal 12 doped with silicon by using silicon tetrafluoride gas as the doping gas provided on underlying substrate 11 by vapor phase growth is a first group III nitride semiconductor crystal 12a. Then, a second group III nitride semiconductor crystal 12b doped with silicon by using silicon tetrafluoride gas as the doping gas is grown in a similar manner on first group III nitride semiconductor crystal 12a. Thus, there are produced underlying layer 11, first group III nitride semiconductor crystal 12a on underlying substrate 11, and second group III nitride semiconductor crystal 12b on first group III nitride semiconductor crystal 12a.

Figure 8:
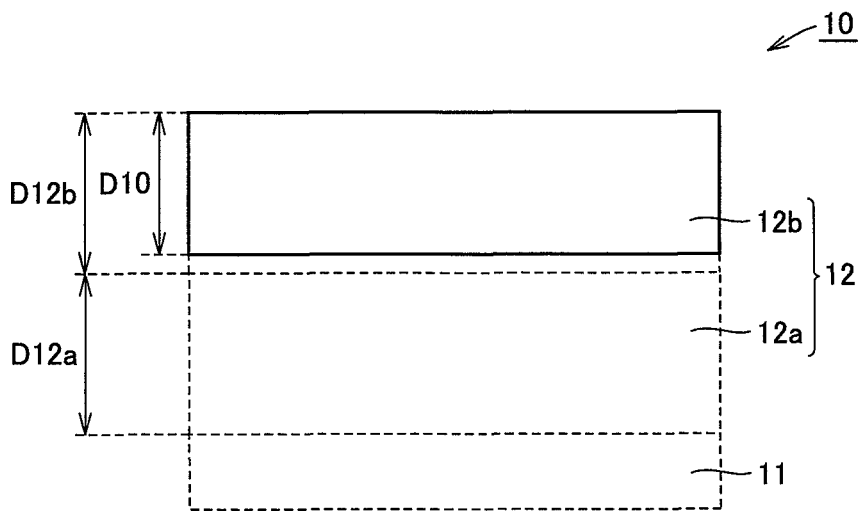
FIG. 8 is a schematic diagram of a group III nitride semiconductor crystal representing a state of at least the underlying substrate removed in the first modification of the first embodiment.

Then, at least underlying substrate 11 is removed, as shown in FIG. 8, to fabricate a group III nitride semiconductor crystal substrate constituted of at least one of first and second group III nitride semiconductor crystals 12a and 12b having a thickness D10 of at least 100 μm. In the present modification, a group III nitride semiconductor crystal substrate constituted of second group III nitride semiconductor crystal 12b is fabricated by removing first group III nitride semiconductor crystal 12a and a portion of second group III nitride semiconductor crystal 12b. In this case, a group III nitride semiconductor crystal substrate 10 of further favorable crystallinity can be obtained by taking first group III nitride semiconductor crystal 12a as a buffer layer directed to matching with underlying substrate 11 in the lattice constant, and growing second group III nitride semiconductor crystal 12b of further favorable crystallinity thereon.

Second Modification

A fabrication method of a group III nitride semiconductor crystal substrate according to a second modification of the present embodiment will be described hereinafter with reference to FIG. 9.

Figure 9:
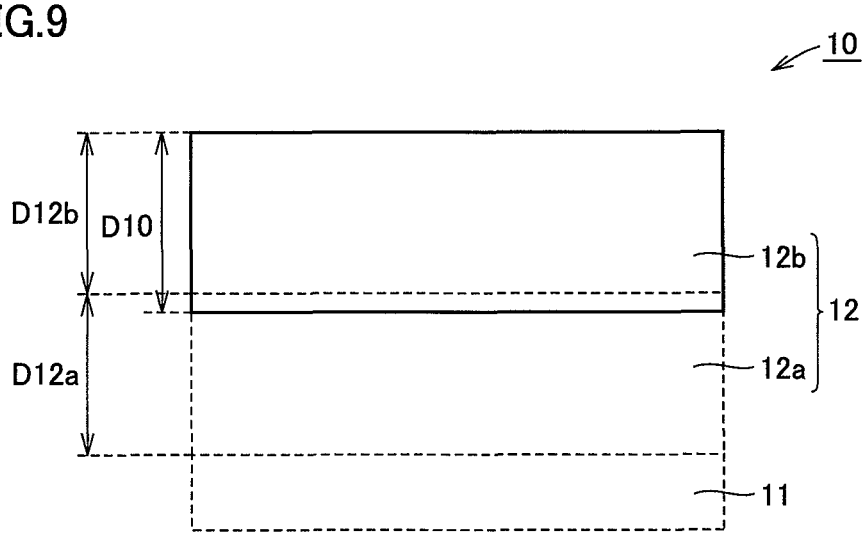
FIG. 9 is a schematic diagram of a group III nitride semiconductor crystal representing a state of at least the underlying substrate removed in a second modification of the first embodiment.

As shown in FIG. 9, the fabrication method of a group III nitride semiconductor crystal substrate of the present modification is basically similar to the fabrication method of a group III nitride semiconductor crystal substrate in the first modification, and differs in that a group III nitride semiconductor crystal substrate 10 including first and second group III nitride semiconductor crystals 12a and 12b is fabricated by removing a portion of first group III nitride semiconductor crystal 12a in the step of removing at least the underlying substrate (step S3).

In group III nitride semiconductor crystal substrate 10 of the present modification, the two layers of group III nitride semiconductor crystals 12a and 12b may be of the same composition or of different compositions. Furthermore, the growing method of a group III nitride semiconductor crystal of the present invention is not particularly limited to the method of growing one or two layers of group III nitride semiconductor crystal. Three or more layers of a group III nitride semiconductor crystal may be grown.

As set forth above, group III nitride semiconductor crystal substrate 10 of the present embodiment and modifications thereof has a resistivity is at least $1\times10^{-4}$ Ω·cm and not more than 0.1 Ω·cm, a resistivity distribution in the diameter direction of at least −30% and not more than 30%, and a resistivity distribution in the thickness direction of at least −16% and not more than 16%.

In the present embodiment and modifications thereof, silicon tetrafluoride gas is used as the doping gas in growing group III nitride semiconductor crystal 12 doped with silicon under the condition that decomposition of the doping gas is to be prevented and reaction per se with another gas is suppressed. Silicon tetrafluoride gas is characterized in that, as compared to other doping gases directed to doping silicon, the gas per se is not readily decomposed, and does not easily react with another gas such as the raw material gas for the group III nitride semiconductor crystal and the carrier gas. Particularly, it is to be noted that silane, disilane, chlorosilane, dichlorosilane, monochlorosilane and tetrachlorosilane react with ammonia gas that is the raw material of nitrogen (N) at a temperature in the vicinity of the room temperature, whereas silicon tetrafluoride gas does not react with ammonia gas even if raised up to 1200° C. Therefore, the event of the silicon tetrafluoride gas being decomposed prior to arrival at underlying substrate 11 to adhere to a region other than underlying substrate 11 and/or generation of an $Si_xN_y$ (silicon nitride) type compound (x and y are arbitrary integers) caused by the reaction of silicon in the silicon tetrafluoride can be suppressed. Accordingly, control over the concentration of tetrafluoride gas qualified as the doping gas allows the concentration of silicon serving as the dopant to be controlled readily. As a result, the amount of silicon taken in group III nitride semiconductor crystal 12 can be regulated at a constant level. Thus, the resistivity of group III nitride semiconductor crystal 12 can be readily controlled.

Since the amount of silicon in the silicon tetrafluoride gas can be controlled readily, it is not necessary to supply the silicon tetrafluoride gas to underlying substrate 11 at a high rate. Therefore, doping gas can be supplied uniformly to underlying substrate 11 since first group III nitride semiconductor crystal 12 can be grown by supplying doping gas at an appropriate flow rate directed to growing the crystal. Therefore, degradation in the resistivity in-plane distribution of group III nitride semiconductor crystal 12 to be grown can be prevented.

Group III nitride semiconductor crystal substrate 10 of the present embodiment and modifications thereof is based on group III nitride semiconductor crystal 12 having the resistivity reduced by readily controlling the resistivity and degradation in the resistivity in-plane distribution prevented. By virtue of the resistivity being not more than 0.1 Ω·cm, group III nitride semiconductor crystal substrate 10 is conveniently selected as an n type substrate employed in electronic devices and light-emitting devices improved in the properties such as the low ON-resistance and high breakdown voltage. Since the resistivity is at least $1\times10^{-4}$ Ω·cm, it is not necessary to dope silicon in high concentration. Therefore, generation of a pit or defect as well as a crack during growth of a group III nitride semiconductor crystal can be suppressed. In the case where the resistivity distribution in the diameter direction is at least −30% and not more than 30% and the resistivity distribution in the thickness direction of the group III nitride semiconductor crystal substrate is at least −16% and not more than 16%, variation in the properties, when semiconductor devices are produced using the group III nitride semiconductor crystal substrate, can be suppressed. Therefore, the yield can be improved.

Second Embodiment

A group III nitride semiconductor crystal substrate according to a second embodiment of the present invention is similar to group III nitride semiconductor crystal substrate 10 of the first embodiment shown in FIGS. 1 and 2. The fabrication method of a group III nitride semiconductor crystal substrate of the second embodiment differs from the fabrication method of a group III nitride semiconductor crystal of the first embodiment.

Specifically, the fabrication method of the present embodiment differs from the fabrication method of the first embodiment in that silicon tetrachloride gas is used as the doping gas to grow a group III nitride semiconductor crystal.

In detail, group III nitride semiconductor crystal 12 doped with silicon by using silicon tetrachloride gas as the doping gas is grown on underlying substrate 11 by vapor phase growth (step S2). In the present embodiment, silicon tetrachloride gas alone is employed for the doping gas. Elements differing from those of the first embodiment will be described in detail hereinafter.

In the case where the doping gas is silicon tetrachloride gas, the growth rate of group III nitride semiconductor crystal 12 is at least 200 μm/h and not more than 2000 μm/h, preferably at least 300 μm/h and not more than 600 μm/h. In the case where the growth rate of group III nitride semiconductor crystal 12 is at least 200 μm/h, group III nitride semiconductor crystal 12 is grown to fill an $Si_xN_y$ layer of a minute amount, when formed at the growing face of group III nitride semiconductor crystal 12, since the growth rate of group III nitride semiconductor crystal 12 is sufficiently higher than the growth rate of the $Si_xN_y$ layer. Therefore, the influence of an $Si_xN_y$ layer being formed can be suppressed. Accordingly, control of the concentration of silicon qualified as the dopant is facilitated by adjusting the concentration of the silicon tetrachloride gas. As a result, the concentration of silicon taken in can be regulated at a constant level. Thus, the resistivity of group III nitride semiconductor crystal 12 can be readily controlled. In the case where the growth rate of group III nitride semiconductor crystal 12 is at least 300 μm/h, the resistivity of group III nitride semiconductor crystal 12 can be controlled more readily. In the case where the growth rate of group III nitride semiconductor crystal 12 is not more than 2000 μm/h, degradation of the crystallinity of group III nitride semiconductor crystal 12 to be grown is suppressed. In the case where the growth rate of group III nitride semiconductor crystal 12 is not more than 600 μm/h, degradation in the crystallinity of group III nitride semiconductor crystal 12 can be further suppressed.

The partial pressure of the silicon tetrachloride gas during growing group III nitride semiconductor crystal 12 is preferably at least $1\times10^{-6}$ atm and not more than $2\times10^{-4}$ atm. In the case where the partial pressure of the silicon tetrachloride gas is at least $1\times10^{-6}$ atm, silicon qualified as the n dopant can be sufficiently taken in group III nitride semiconductor crystal 12. In the case where the partial pressure of the silicon tetrachloride gas is not more than $2\times10^{-4}$ atm, silicon can be doped with further favorable controllability since the generation of an $Si_xN_y$ (silicon nitride) type compound can be further suppressed. In consideration of the concentration of silicon doped into group III nitride semiconductor crystal 12, the partial pressure of silicon tetrachloride gas is not more than $1.0 \times 10^{-5}$ atm. The total of respective partial pressures (entirety) of each of the gases in reaction tube 110 such as the raw material gas, carrier gas, and doping gas is 1 atm. The concentration of the silicon tetrachloride gas is proportional to the partial pressure.

The rate of supplying doping gas G2 is preferably at least 100 cm/min and not more than 1000 cm/min, more preferably at least 250 cm/min and not more than 500 cm/min. By setting the rate within this range, variation in the concentration distribution of doping gas G2 that is supplied can be suppressed.

Thus, group III nitride semiconductor crystal 12 can be grown on underlying substrate 11 shown in FIG. 4. Using this group III nitride semiconductor crystal 12, a group III nitride semiconductor crystal substrate is fabricated in a manner similar to that of the first embodiment. Thus, there is obtained a group III nitride semiconductor crystal substrate having a resistivity of at least $1 \times 10^{-4}$ Ω·cm and not more than 0.1 Ω·cm, a resistivity distribution in the diameter direction of at least −30% and not more than 30%, and a resistivity distribution in the thickness direction of at least −16% and not more than 16%.

The remaining elements in the growing method of a group III nitride semiconductor crystal 12 and the fabrication method of a group III nitride semiconductor crystal substrate are similar to those in the growing method of a group III nitride semiconductor crystal 12 and the fabrication method of a group III nitride semiconductor crystal substrate 10 of the first embodiment. The same elements have the same reference characters allotted, and description thereof will not be repeated.

The fabrication method of the present embodiment is applicable to, not only the first embodiment, but also to modifications thereof.

In the growing method of a group III nitride semiconductor crystal 12 in the first modification of the first embodiment shown in FIGS. 6 and 7, first group III nitride semiconductor crystal 12a preferably has a relatively low silicon concentration of not more than $1 \times 10^{17}$ cm$^{-3}$, and second group III nitride semiconductor crystal 12b has a relatively high silicon concentration exceeding $1 \times 10^{17}$ cm$^{-3}$. In this case, there can be obtained a second group III nitride semiconductor crystal 12b having growth inhibition caused by the formation of an Si$_x$N$_y$ film prevented.

[Modification]

Figure 10:
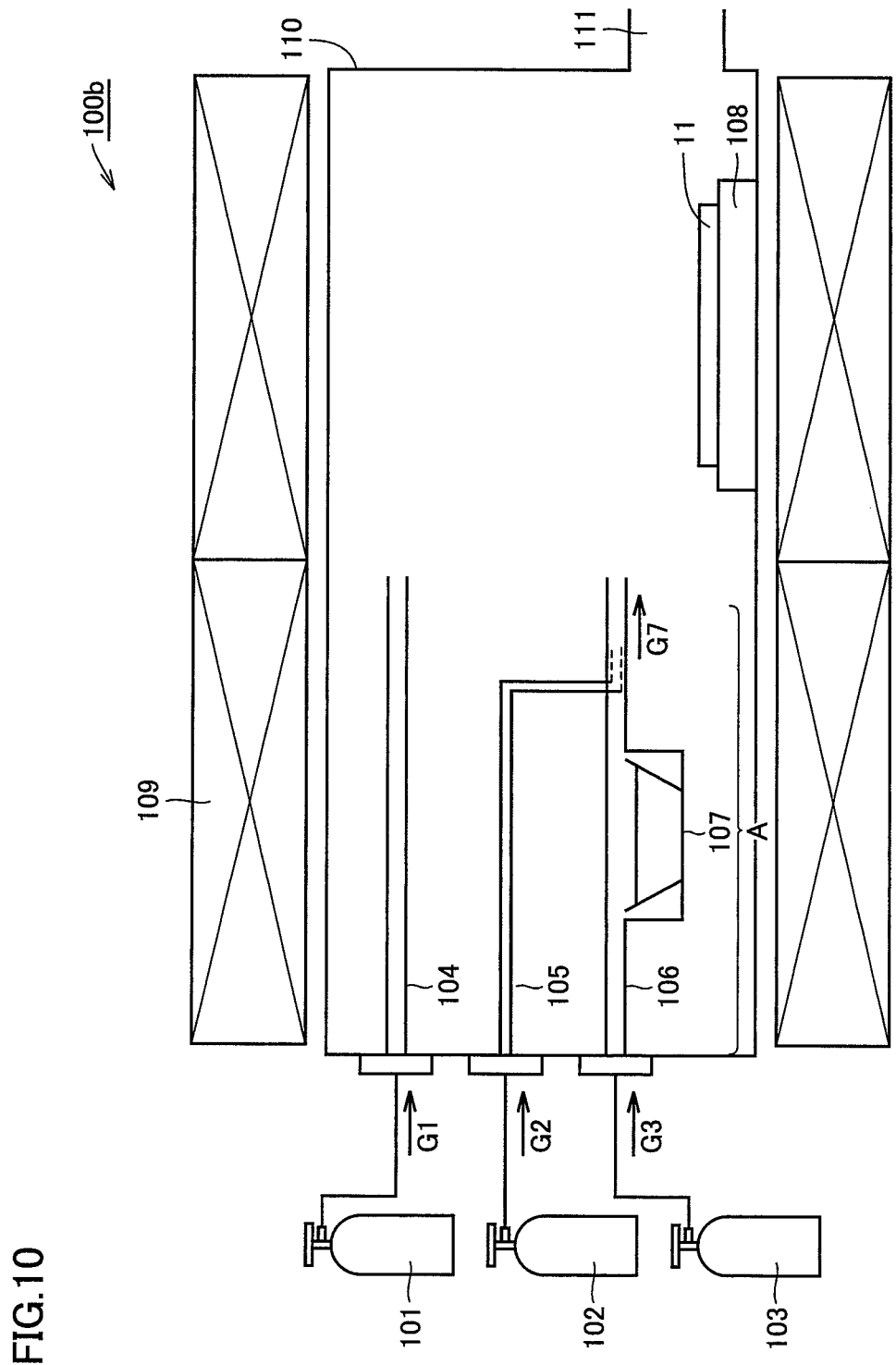
FIG. 10 is a schematic view of another HVPE apparatus employed in a growing method of a group III nitride semiconductor crystal according to a second embodiment of the present invention.

An HVPE apparatus 100b shown in FIG. 10 has a configuration basically similar to that of HVPE apparatus 100a set forth above, provided that doping gas introduction pipe 105 has a smaller diameter, and that doping gas introduction pipe 105 and second gas introduction pipe 106 interconnect each other at the exit side.

HVPE apparatus 100b is characterized in that the flow rate of doping gas G2 is increased due to the smaller diameter of doping gas introduction pipe 105. The diameter of doping gas introduction pipe 105 is set to realize a flow rate of doping gas G2 that can maintain a favorable resistivity in-plane distribution.

By the interconnection between doping gas introduction pipe 105 and second gas introduction pipe 106, the timing of the contact between doping gas G2 and first raw material gas G1 is delayed. HVPE apparatus 100b is characterized in that the duration of doping gas G2 brought into contact with first raw material gas G1 at a region A is shortened. In the case where second raw material gas G3 has low reactivity with doping gas G2 and first raw material gas G1 has high reactivity with doping gas G2, reaction of doping gas G2 with first raw material gas G1 can be suppressed. Accordingly, controllability in the concentration of the supplied silicon can be improved. Therefore, group III nitride semiconductor crystal 12 is preferably grown using HVPE apparatus 100b of FIG. 10. HVPE apparatus 100b of FIG. 10 is conveniently selected in the case where silicon tetrachloride is employed for the doping gas.

In the case where group III nitride semiconductor crystal 12 is grown in HVPE apparatus 100b, the supply rate of doping gas G2 is preferably at least 250 cm/min. In this case, thermal decomposition of doping gas G2 at region A can be suppressed when region A attains a high temperature of 800° C. or above in HVPE apparatus 10b.

This fabrication method of the present modification can be applied to, not only the second embodiment, but also the first embodiment and modifications thereof.

In the present embodiment and modification thereof, silicon tetrachloride gas is employed as the doping gas, and the growth rate of group III nitride semiconductor crystal 12 constituting group III nitride semiconductor crystal substrate 10 is set to at least 200 μm/h and not more than 2000 μm/h in growing a group III nitride semiconductor crystal 12 doped with silicon under the condition that decomposition of doping gas is prevented and the influence of reaction with another gas is reduced when silicon is doped. Silicon tetrachloride gas is characterized in that, as compared to other gases directed to doping silicon such as silane, disilane, trichlorosilane, dichlorosilane and monochlorosilane, the gas per se is not readily decomposed. Therefore, the event of the silicon tetrachloride gas being decomposed before reaching underlying substrate 11 to adhere to a site other than underlying substrate 11 can be prevented.

The growth rate of group III nitride semiconductor crystal 12 is set to at least 200 μm/h, for example, even in the case where silicon tetrachloride gas reacts with another gas such as first raw material gas G1 and/or the carrier gas of group III nitride semiconductor crystal 12 to generate an Si$_x$N$_y$ layer. Accordingly, a group III nitride semiconductor crystal will grow laterally so as to fill an Si$_x$N$_y$ layer of a minute amount, when formed at the growing face of group III nitride semiconductor crystal 12, since the growth rate of group III nitride semiconductor crystal 12 is sufficiently higher than the growth rate of the Si$_x$N$_y$ layer. Since the influence of the formation of an Si$_x$N$_y$ layer can be suppressed, control of the concentration of silicon that is the dopant is facilitated by regulating the concentration of silicon tetrachloride gas. As a result, the concentration of silicon taken in can be regulated at a constant level. Thus, the resistivity of the group III nitride semiconductor crystal can be readily controlled.

Since the concentration of silicon in the silicon tetrachloride gas can be readily controlled, it is not necessary to supply the silicon tetrachloride gas to underlying substrate 11 at high rate. Accordingly, group III nitride semiconductor crystal 12 can be grown by supplying the silicon tetrachloride gas at an appropriate rate, and the silicon tetrachloride gas can be supplied uniformly to the underlying substrate as the doping gas. Therefore, degradation in the resistivity in-plane distribution of group III nitride semiconductor crystal 12 to be grown can be prevented.

Thus, the group III nitride semiconductor crystal substrate of the present embodiment is based on a group III nitride semiconductor crystal having the resistivity reduced by readily controlling the resistivity, and degradation in the resistivity in-plane distribution prevented. Thus, there can be obtained a group III nitride semiconductor crystal substrate having a resistivity of at least $1 \times 10^{-4}$ Ω·cm and not more than 0.1 Ω·cm, a resistivity distribution in the diameter direction of at least −30% and not more than 30%, and a resistivity distribution in the thickness direction of at least −16% and not more than 16%.

Third Embodiment

A group III nitride semiconductor crystal according to a third embodiment will be described with reference to FIG. 11.

Figure 11:
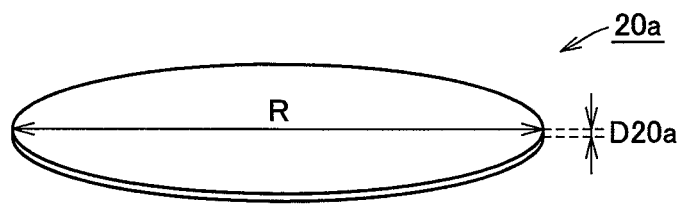
FIG. 11 is a schematic perspective view of a group III nitride semiconductor crystal substrate according to a third embodiment of the present invention.

As shown in FIG. 11, a group III nitride semiconductor crystal substrate 20a of the present embodiment is basically similar to group III nitride semiconductor crystal substrate 10 of the first embodiment shown in FIG. 1, provided that the thickness D20a is at least 100 μm and not more than 1000 μm.

Thickness D20a of group III nitride semiconductor crystal substrate 20a is at least 100 μm and not more than 1000 μm, preferably at least 60 μm and not more than 300 μm. In the case where thickness D20a is at least 100 μm, there can be obtained a group III nitride semiconductor crystal substrate 20a having generation of a crack during handling prevented. In the case where thickness D20a is at least 60 μm, a group III nitride semiconductor crystal substrate 20a having generation of a crack further prevented is obtained. In the case where thickness D20a is not more than 1000 μm, the substrate can be conveniently employed for semiconductor devices. Moreover, the fabrication cost per one group III nitride semiconductor crystal substrate 20a can be reduced. In the case where thickness D20a is not more than 300 μm, the fabrication cost per one group III nitride semiconductor crystal substrate 20a can be further reduced.

As used herein, "resistivity distribution in the thickness direction" refers to a value measured by a method set forth below. Specifically, the resistivity is measured at each site of the total of 2 points at respective arbitrary thickness, i.e. one point in the proximity of main face 10a, and one point in the proximity of a face 10b opposite to main face 10a, by the four probe method at room temperature. The average of the 2 values of resistivity is calculated. With regards to the values of resistivity at the 2 points, the value defined by (largest value−average value)/average value is taken as the upper limit of the resistivity distribution in the diameter direction, and the value defined by (smallest value−average value)/average value is taken as the lower limit of the resistivity distribution in the diameter direction.

Hereinafter, a fabrication method of a group III nitride semiconductor crystal substrate according to the present embodiment will be described hereinafter with reference to FIG. 12.

Figure 12:
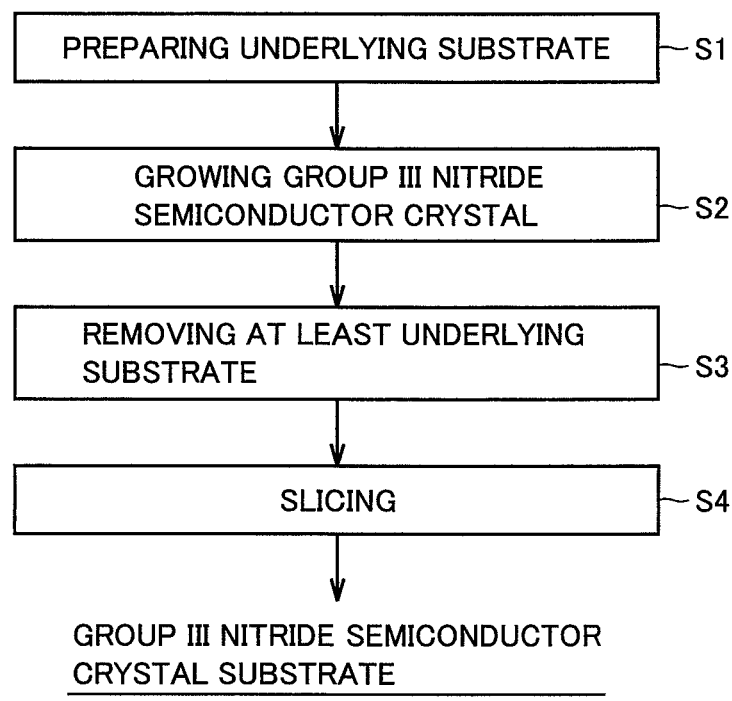
FIG. 12 is a flowchart of a fabrication method of a group III nitride semiconductor crystal substrate of the third embodiment.

As shown in FIG. 12, a group III nitride semiconductor crystal 12 is grown according to the growing method of group III nitride semiconductor crystal 12 (steps S1, S2) of the first embodiment set forth above. Then, at least underlying substrate 11 is removed (step S3), likewise with the first embodiment. Accordingly, a group III nitride semiconductor crystal substrate 10 of the first embodiment is fabricated.

Then, group II nitride semiconductor crystal 12 is sliced in the thickness direction to produce a plurality of group III nitride semiconductor crystal substrates 20a-20m constituted of a group III nitride semiconductor crystal 12 having a thickness of at least 100 μm and not more than 1000 μm (step S4).

Figure 13:
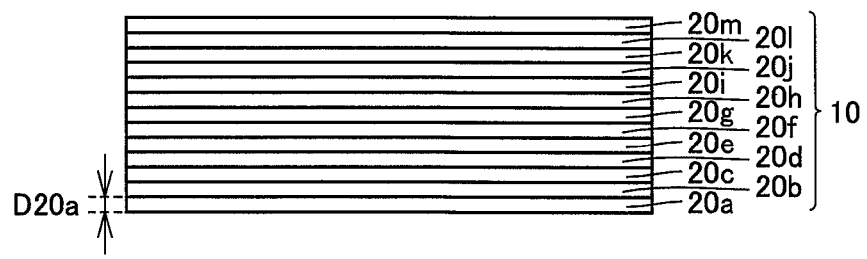
FIG. 13 is a schematic diagram of a group III nitride semiconductor crystal substrate representing a slicing state of the third embodiment.

As shown in FIG. 13, group III nitride semiconductor crystal substrate 10 is worked into a plurality of group III nitride semiconductor crystal substrates 20a-20m having a desired thickness. The slicing method is not particularly limited, and a slicer having an outer peripheral edge of a diamond electrolytic deposited wheel, a wire saw or the like may be used.

Modification

Figure 14:
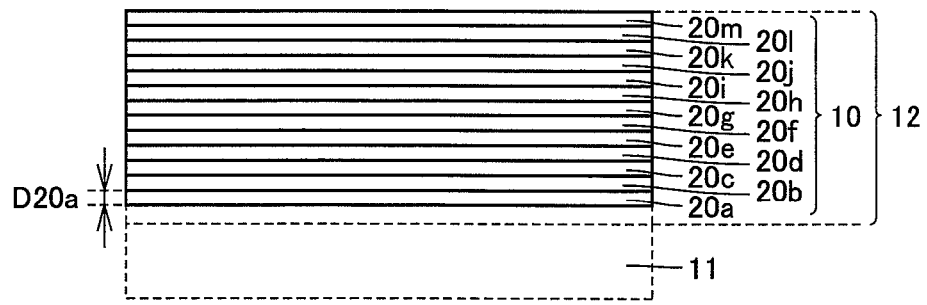
FIG. 14 is a schematic diagram of a fabrication method of a group III nitride semiconductor crystal substrate according to a modification of the third embodiment.

A fabrication method of a group III nitride semiconductor crystal substrate of the present modification is basically similar to the fabrication method of a group III nitride semiconductor crystal substrate of the third embodiment, provided that the order of the steps differs, as shown in FIG. 14.

Specifically, by carrying out a growing method of a group III nitride semiconductor crystal substrate in a manner similar to that of the first embodiment, a group III nitride semiconductor crystal 12 is grown on underlying substrate 11. Then, by slicing group III nitride semiconductor crystal 12 in the thickness direction, a plurality of group III nitride semiconductor crystal substrates 20a-20m constituted of group III nitride semiconductor crystal 12 having a thickness of at least 100 μm and not more than 1000 μm are produced (step S4). As a result, at least underlying substrate 11 is removed from group III nitride semiconductor crystal 12 (step S3). Namely, group III nitride semiconductor crystal substrates 20a-20m are sliced prior to the removal of underlying substrate 11.

The remaining elements as to the configuration and fabrication method of group III nitride semiconductor crystal substrate 20a are similar to those of group III nitride semiconductor crystal substrate 10 of the first embodiment. The same elements have the same reference characters allotted, and description thereof will not be repeated.

The present embodiment and modification can be applied to, not only the first embodiment, but also the modifications of the first embodiment as well as the second embodiment and modification thereof.

Group III nitride semiconductor crystal substrate 20a according to the present embodiment and modification thereof, obtained by the fabrication method of group III nitride semiconductor crystal substrate 20a set forth above, has a resistivity of at least $1 \times 10^{-4}$ Ω·cm and not more than 0.1 Ω·cm, a resistivity distribution in the diameter direction of at least −30% and not more than 30%, and a resistivity distribution in the thickness direction of at least −16% and not more than 16%.

Thus, group III nitride semiconductor crystal substrate 20a of the present embodiment and modification thereof is fabricated under the conditions that decomposition of the doping gas is suppressed and reaction with another gas is suppressed, or the effect of reaction is reduced in doping silicon in a group III nitride semiconductor crystal substrate 20a including silicon as the impurity. Thus, there can be obtained group III nitride semiconductor crystal substrates 20a-20m having the resistivity reduced by readily controlling the resistivity, and degradation in the resistivity in-plane distribution suppressed.

Although the foregoing ranges have been cited for thickness D10, D20a and for diameter R of group III nitride semiconductor crystal substrates 10 and 20a in the first embodiment, first and second modifications thereof, the second embodiment and modification thereof, the thickness of group III nitride semiconductor crystal substrate 10 of the present invention is not particularly limited. Moreover, the present invention is not particularly limited to the fabrication method of group III nitride semiconductor crystal substrate 10 described in the first embodiment, first and second modifications thereof, the second embodiment and modification thereof.

The number of sample sites to be measured for the resistivity distribution in the thickness direction corresponds to 5 points in the case where the thickness of group III nitride semiconductor crystal 12 or group III nitride semiconductor crystal substrate 10 is at least 2 mm, and corresponds to 2 points in the case where the thickness of group III nitride semiconductor crystal 12 is less than 2 mm.

Fourth Embodiment

Figure 15:
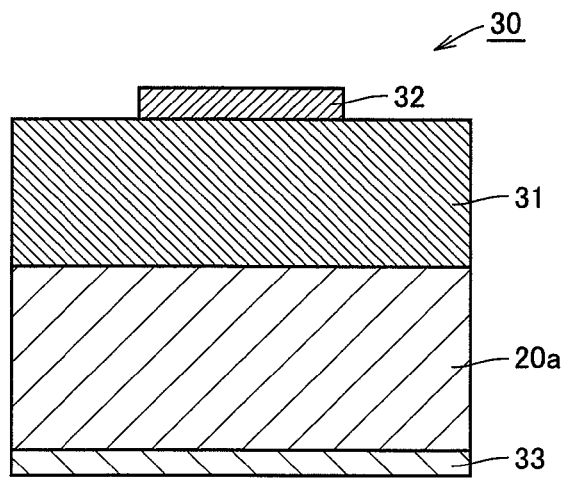
FIG. 15 is a schematic sectional view of a semiconductor device according to a fourth embodiment of the present invention.

Referring to FIG. 15, a Schottky barrier diode (SBD) that is a semiconductor device of the present embodiment includes group III nitride semiconductor crystal substrate 20a of the third embodiment, a drift layer 31 as an epitaxial layer, a Schottky electrode 32, and an ohmic electrode 33.

Drift layer 31 is formed on group III nitride semiconductor crystal substrate 20a. Schottky electrode 32 is formed on drift layer 31. Ohmic electrode 33 is formed on a face opposite to the face where drift layer 31 is provided in group III nitride semiconductor crystal substrate 20a.

Although the present embodiment is described in which the Schottky barrier diode includes group III nitride semiconductor crystal substrate 20a of the third embodiment, the Schottky barrier diode may include a group III nitride semiconductor crystal substrate 10 of the first or second embodiment.

Although a Schottky barrier diode is taken as an example of a semiconductor device in the present embodiment, the present invention is not particularly limited thereto. For example, optical devices such as a light-emitting diode and laser diode, electronic devices such as a Schottky barrier diode, rectifier, bipolar transistor, field effect transistor, HEMT (High Electron Mobility Transistor), semiconductor sensors such as a temperature sensor, pressure sensor, radiation sensor, and visible-ultraviolet photodetector, as well as a SAW (Surface Acoustic Wave Device), transducer, resonator, oscillator, MEMS component, and piezoactuator can be cited.

As set forth above, Schottky barrier diode 30 that is an example of a semiconductor device of the present embodiment includes group III nitride semiconductor crystal substrate 20a of the third embodiment. Group III nitride semiconductor crystal substrates 10 and 20a-20m of the first to third embodiments and modifications thereof can have the resistivity reduced and degradation in the resistivity in-plane distribution prevented. Since group III nitride semiconductor crystal substrates 10 and 20a-20m having the resistivity in-plane distribution suppressed are used, variation in properties can be suppressed. Therefore, the yield can be improved. Furthermore, since group III nitride semiconductor crystal substrates 10 and 20a-20m having low resistivity are used, properties such as low ON-resistance and high breakdown voltage can be improved.

Example 1

In the present example, the conditions to fabricate a group III nitride semiconductor crystal substrate of the present invention were studied. Specifically, group III nitride semiconductor crystal substrates of Specimens 1-18 were fabricated according to the third embodiment. The resistivity, the resistivity distribution in the diameter direction and thickness direction, and the silicon concentration were measured. Moreover, the surface state was observed.

[Specimens 1-18]

First, an underlying substrate 11 formed of gallium nitride having a diameter of 105 mm and a thickness of 400 μm was prepared (step S1). The main face of underlying substrate 11 corresponds to the (0001) plane.

Then, a gallium nitride crystal was grown as a group III nitride semiconductor crystal doped with silicon, using the doping gas shown in Table 1 set forth below, on underlying substrate 11 by HVPE as the vapor phase growth (step S2).

At step S2, the gallium nitride crystal was grown using HVPE apparatus 100a of FIG. 5. Ammonia gas and hydrogen chloride gas were prepared as first raw material gas G1 and second raw material gas G3, respectively. The gas set forth in Table 1 was prepared as doping gas G2. Hydrogen having the purity of at least 99.999% was prepared as carrier gas. Carrier gas was introduced into reaction tube 110 from each of first gas introduction pipe 104, second gas introduction pipe 106, and doping gas introduction pipe 105. The temperature of heater 109 was raised to 1100° C. Then, gallium was supplied to source boat 107, and source boat 107 was heated.

GaCl (gallium chloride) gas was generated as reaction gas G7 by the reaction of hydrogen chloride gas supplied from second gas introduction pipe 106 with the gallium on source boat 107, as expressed by Ga+HCl→GaCl+½H$_2$.

Then, ammonia gas that is first raw material gas G1 supplied from first gas introduction pipe 104 and gallium chloride gas were delivered together with the carrier gas to strike the surface of underlying substrate 11 where a gallium nitride crystal is to be grown, causing the reaction of GaCl+NH$_3$→GaN+HCl+H$_2$ at the surface.

The conditions for growing a gallium nitride crystal including the growth rate of gallium nitride crystal, the partial pressure and the flow rate of supplying doping gas were as set forth in Table 1. Thus, a group III nitride semiconductor crystal 12 formed of a gallium nitride crystal having a diameter of 105 mm and a thickness of 10 mm was grown.

Then, the underlying substrate was removed from the gallium nitride crystal identified as group III nitride semiconductor crystal 12 (step S3). The crystal was sliced in the thickness direction (step S4). Then, working steps such as grinding, polishing, dry etching, and the like were applied to remove the denatured layer. Thus, thirteen group III nitride semiconductor crystal substrates formed of gallium nitride crystal having a diameter of 100 mm and a thickness of 400 μm, were obtained. Among the thirteen group III nitride semiconductor crystal substrates, the group III nitride semiconductor crystal substrate (group III nitride semiconductor crystal substrate 20g in FIG. 13) located at the middle in the thickness direction was taken as the group III nitride semiconductor crystal substrate for Specimens 1-18.

[Measurement Method]

The resistivity, the resistivity distribution in the diameter direction, resistivity distribution in the thickness direction, and the silicon concentration were measured by the method set forth below for the gallium nitride crystal substrates of Specimens 1-18. The results are shown in Table 1.

The surface of the group III nitride semiconductor crystal substrate of Specimens 1-18 was mirror-polished, and any damage layer caused by polishing was removed by dry etching. Then, the resistivity was measured at each site of the total of 9 points, i.e. 5 points along a given diameter including one point around the center, two points around either ends, and respective intermediate points between the center and either end (two points), and 4 points along a diameter orthogonal to the given diameter including two points around either ends and respective intermediate points between the center and either end (two points), by the four probe method at room temperature. The average of the nine points was taken as the resistivity. The value defined by (largest value−average value)/average value was taken as the upper limit of the resistivity distribution in the diameter direction, and the value defined by (smallest value−average value)/average value was taken as the lower limit of the resistivity distribution in the diameter direction. In Table 1, "<±22" refers to the range from −22% to 22%.

The resistivity distribution in the thickness direction is a value measured by a method set forth below. Likewise with the above-described method, the top face and bottom face of the group III nitride semiconductor crystal substrate were subjected to surface polishing and dry etching. The resistivity was measured at each site of the total of 2 points, i.e. one point in the proximity of the main face, and one point in the proximity of the face opposite to the main face, by the four probe method at room temperature. The average of the 2 values of resistivity was calculated. With regards to the values of resistivity at the 2 points, the value defined by (largest value–average value)/average value was taken as the upper limit of the resistivity distribution in the thickness direction, and the value defined by (smallest value–average value)/average value was taken as the lower limit of the resistivity distribution in the thickness direction. In Table 1, "<±13" refers to the range of −13% to 13%.

The silicon concentration was measured based on the specimens directed to the 9-point measurement employed for measuring the resistivity. The specimen was cut into 5 mm square. The silicon concentration of the cut measurement specimen was measured by SIMS. The average thereof was taken as the average value of the silicon concentration.

The surface state of the main face of the gallium nitride crystal substrate of Specimens 1-18 was observed through a Nomarski microscope.

tion of at least −27% and not more than 27%, low variation in the resistivity distribution in the thickness direction of at least −16% and not more than 16%, and a high silicon concentration of at least $5 \times 10^{16}$ cm$^{-3}$ and not more than $5 \times 10^{20}$ cm$^{-3}$.

The gallium nitride crystal for fabricating the gallium nitride crystal substrates of Specimens 1-12 had a flat surface with almost no unevenness observed at the growing surface. The gallium nitride crystal exhibited no generation of pits and was mono crystalline.

In contrast, Specimens 13-16 based on the usage of dichlorosilane as the doping gas exhibited a high resistivity exceeding 0.1 Ω·cm.

As a matter of logic, the resistivity and the silicon concentration in the grown gallium nitride crystal should be identical between Specimen 13 and Specimen 2 since the growth rate of gallium nitride as well as the partial pressure and flow rate of the doping gas are the same as those of Specimen 2. However, Specimen 13 based on the usage of dichlorosilane as the doping gas exhibited a resistivity higher than that of Specimen 2 and a silicon concentration lower than that of Specimen 2 in the gallium nitride crystal substrate. It was therefore appreciated from such results that the silicon dopant could not be taken in the growing gallium nitride crystal sufficiently when dichlorosilane is used as the doping gas due to the decomposition of dichlorosilane and reaction with another gas.

TABLE 1

| | No. | Type of doping gas | Partial pressure of supplied doping gas (atm) | Flow rate of doping gas (cm/min) | Growth rate (μm/h) | Resistivity (Ω·cm) | Si Concentration (cm$^{-3}$) | Resistivity distribution in diameter direction (%) | Resistivity distribution in thickness direction (%) |
|---|---|---|---|---|---|---|---|---|---|
| Examples of Present Invention | 1 | SiF$_4$ | $2.0 \times 10^{-7}$ | 250 | 300 | $1.0 \times 10^{-1}$ | $5.0 \times 10^{16}$ | <±15 | <±7 |
| | 2 | SiF$_4$ | $2.0 \times 10^{-6}$ | 250 | 300 | $1.0 \times 10^{-2}$ | $2.0 \times 10^{18}$ | <±17 | <±8 |
| | 3 | SiF$_4$ | $3.0 \times 10^{-6}$ | 250 | 300 | $8.0 \times 10^{-3}$ | $3.0 \times 10^{18}$ | <±9 | <±4 |
| | 4 | SiF$_4$ | $1.0 \times 10^{-5}$ | 250 | 300 | $1.0 \times 10^{-3}$ | $5.0 \times 10^{19}$ | <±17 | <±8 |
| | 5 | SiF$_4$ | $4.0 \times 10^{-5}$ | 250 | 300 | $1.0 \times 10^{-4}$ | $5.0 \times 10^{20}$ | <±17 | <±9 |
| | 6 | SiCl$_4$ | $1.0 \times 10^{-6}$ | 250 | 300 | $1.0 \times 10^{-1}$ | $5.0 \times 10^{16}$ | <±22 | <±13 |
| | 7 | SiCl$_4$ | $1.0 \times 10^{-5}$ | 250 | 300 | $1.0 \times 10^{-2}$ | $2.0 \times 10^{18}$ | <±25 | <±15 |
| | 8 | SiCl$_4$ | $2.0 \times 10^{-5}$ | 250 | 300 | $8.0 \times 10^{-3}$ | $3.0 \times 10^{18}$ | <±26 | <±15 |
| | 9 | SiCl$_4$ | $5.0 \times 10^{-5}$ | 250 | 300 | $1.0 \times 10^{-3}$ | $5.0 \times 10^{19}$ | <±25 | <±12 |
| | 10 | SiCl$_4$ | $2.0 \times 10^{-4}$ | 250 | 300 | $1.0 \times 10^{-4}$ | $5.0 \times 10^{20}$ | <±27 | <±14 |
| | 11 | SiCl$_4$ | $1.0 \times 10^{-5}$ | 250 | 200 | $8.0 \times 10^{-3}$ | $3.0 \times 10^{18}$ | <±22 | <±12 |
| | 12 | SiCl$_4$ | $1.0 \times 10^{-4}$ | 250 | 2000 | $6.0 \times 10^{-3}$ | $4.5 \times 10^{18}$ | <±26 | <±16 |
| Comparative Examples | 13 | SiH$_2$Cl$_2$ | $2.0 \times 10^{-6}$ | 250 | 300 | $1.7 \times 10^{-1}$ | $3.7 \times 10^{16}$ | <±16 | <±8 |
| | 14 | SiH$_2$Cl$_2$ | $2.0 \times 10^{-4}$ | 250 | 300 | $1.2 \times 10^{-1}$ | $6.0 \times 10^{16}$ | <±22 | <±17 |
| | 15 | SiH$_2$Cl$_2$ | $5.0 \times 10^{-4}$ | 250 | 300 | $1.1 \times 10^{-1}$ | $5.0 \times 10^{16}$ | <±24 | <±18 |
| | 16 | SiH$_2$Cl$_2$ | $5.0 \times 10^{-4}$ | 1500 | 300 | $1.3 \times 10^{-2}$ | $1.9 \times 10^{18}$ | <±80 | <±42 |
| | 17 | SiCl$_4$ | $1.0 \times 10^{-5}$ | 250 | 100 | immeasurable | immeasurable | immeasurable | immeasurable |
| | 18 | SiCl$_4$ | $1.0 \times 10^{-4}$ | 250 | 3000 | immeasurable | immeasurable | immeasurable | immeasurable |

[Measurement Results]

It is appreciated from Table 1 that the gallium nitride crystal substrates of Specimens 1-5 based on the grown gallium nitride crystal using silicon tetrafluoride gas as doping gas had a low resistivity of at least $1 \times 10^{-4}$ Ω·cm and not more than 0.1 Ω·cm, low variation of the resistivity distribution in the diameter direction of at least −17% and not more than 17%, low variation of the resistivity distribution in the thickness direction of at least −9% and not more than 9%, and a high silicon concentration of at least $5 \times 10^{16}$ cm$^{-3}$ and not more than $5 \times 10^{20}$ cm$^{-3}$.

The gallium nitride crystal substrates of Specimens 6-12 having a gallium nitride crystal grown at the growth rate of at least 200 μm/h and not more than 2000 μm/h, using silicon tetrachloride gas as the doping gas, exhibited a low resistivity of at least $1 \times 10^{-4}$ Ω·cm and not more than 0.1 Ω·cm, low variation in the resistivity distribution in the diameter direc- Similarly as a matter of logic, the resistivity and silicon concentration in the grown gallium nitride crystal should be identical between Specimen 14 and Specimen 10 since the growth rate of the gallium nitride crystal as well as the partial pressure and flow rate of the doping gas are similar therebetween. However, Specimen 14 based on the usage of dichlorosilane as the doping gas exhibited higher resistivity by three or more orders of magnitude and a lower silicon concentration than those of Specimen 10.

Specimen 16 based on the usage of dichlorosilane as doping gas with the flow rate increased to 1500 cm/min for the purpose of reducing the resistivity had the concentration distribution of the supplied doping gas degraded, although the resistivity was reduced to 0.013 Ω·cm. Therefore, Specimen 16 exhibited a great resistivity distribution in both diameter direction and thickness direction. Variation in the in-plane resistivity was great.

Specimen 17 based on the usage of silicon tetrachloride as the doping gas corresponding to a growth rate of 100 μm/h had $Si_xN_y$ grown since the growth rate of $Si_xN_y$ was more dominant than the growth of gallium nitride. Unevenness occurred at the growing surface. Pits were also generated. The crystal was rendered polycrystalline, exhibiting abnormal growth. Therefore, the resistivity, silicon concentration, and the resistivity distribution could not be measured.

Specimen 18 based on the usage of silicon tetrachloride as the doping gas corresponding to a growth rate of 3000 Ωm/h had unevenness at the surface since the growth rate of gallium nitride was too high. Pits were also generated. The crystal was rendered polycrystalline, exhibiting abnormal growth. Therefore, the resistivity, silicon concentration, and the resistivity distribution could not be measured.

In the case where silicon tetrafluoride gas is employed as the doping gas, or in the case where silicon tetrachloride gas is employed as the doping gas and the growth rate is set to at least 200 μm/h and not more than 200 μm/h for the present examples, the resistivity can be readily controlled and degradation in the resistivity in-plane distribution can be prevented. Thus, it was confirmed that a group III nitride semiconductor crystal substrate can be obtained, having a resistivity of at least $1 \times 10^{-4}$ Ω·cm and not more than 0.1 Ω·cm, a resistivity distribution in the diameter direction of at least −30% and not more than 30%, and a resistivity distribution in the thickness direction of at least −16% and not more than 16%.

Although a gallium nitride crystal was grown as the group III nitride semiconductor crystal in the present examples, it was confirmed that a similar result can be obtained based on a group III nitride semiconductor crystal of another type (group III nitride semiconductor crystal including at least one element of a group III element of B (boron), Al (aluminium), Ga (gallium), In (indium), and Tl (thallium).

Example 2

The effect of improving the properties and yield of a semiconductor device fabricated using the group III nitride semiconductor crystal substrate of the present invention was studied in the present example. Specifically, a Schottky barrier diode of Specimens 19-27 shown in FIG. 15, described in association with the fourth embodiment, was fabricated using the group III nitride semiconductor crystal substrate of Specimens 1-5 and Specimens 13-16. The substrate sheet resistance, characteristic ON-resistance, and yield were measured.

[Specimens 19-27]

First, group III nitride semiconductor crystal substrates 20a of Specimens 1-5 and Specimens 13-16 were prepared. On each group III nitride semiconductor crystal substrate 20a, an n type GaN layer having the thickness of 5 μm was formed as drift layer 31 using trimethyl gallium (TMGa) as the group III raw material, ammonia ($NH_3$) as the group V raw material, and silane ($SiH_4$) as the doping gas, based on MOCVD. The carrier concentration of drift layer 31 was $5 \times 10^{15}$ cm$^{-3}$.

Then, an epitaxial wafer with group III nitride semiconductor crystal substrate 20a and drift layer 31 thereon was rinsed for one minute at room temperature, employing a hydrochloric acid solution having hydrochloric acid and deionized water mixed at the ratio of 1:1.

Then, an ohmic electrode 33 was formed at the back side of group III nitride semiconductor crystal substrate 20a. Specifically, the epitaxial wafer was rinsed with an organic solvent at the face opposite to the side where drift layer 31 of group III nitride semiconductor crystal substrate 20a is formed. Then, 20 nm of Ti (titanium), 100 nm of Al, 20 nm of Ti, and 300 nm of Au (gold) were sequentially layered in the cited order at the back side by EB (electron beam) evaporation. Following deposition of a metal film layered as set forth above, alloying was effected for one minute at 600° C. Thus, a circular ohmic electrode 33 having a diameter of 700 μm was formed in planar configuration.

Then, Schottky electrode 32 was formed on drift layer 31. Specifically, a film formed of Au was deposited to 500 nm by resistance heating evaporation to produce Schottky electrode 32.

By carrying out the steps set forth above, based on one group III nitride semiconductor crystal substrate for each of Specimens 1-5 and Specimens 13-16, thirty-six Schottky barrier diodes for Specimens 19-27 were produced. One Schottky barrier diode had a flat configuration of 1 mm square, and a thickness of 400 μm. The parameters of the Schottky barrier diodes were controlled such that the optimum tradeoff between the characteristic ON-resistance and breakdown voltage could be obtained in the semiconductor device.

[Measurement Method]

The substrate sheet resistance, the characteristic ON-resistance, the ratio of substrate sheet resistance to characteristic ON-resistance, the in-plane distribution of characteristic ON-resistance, the characteristic ON-resistance distribution between substrates, and yield were measured for the Schottky barrier diodes of Specimens 19-27. The results are shown in Table 2 set forth below.

Specifically, the resistivity of the group III nitride semiconductor crystal substrate was measured by the four probe method to obtain the substrate sheet resistance by the following equation.

$$\text{Substrate sheet resistance (m}\Omega\cdot\text{cm}^2) = \text{resistivity} \times \text{thickness}$$

In addition, the characteristic ON-resistance is represented by the following equation.

$$\text{Characteristic ON-resistance (m}\Omega\cdot\text{cm}^2) = \text{substrate sheet resistance} + \text{drift sheet resistance} + \text{electrode sheet resistance drift sheet resistance}$$

The characteristic ON-resistance was measured by the Schottky barrier diode I-V (current-voltage) characteristic. The substrate sheet resistance was measured in advance by the four probe measurement. The electrode sheet resistance was measured by the TLM (Transmission Line Model) method. Accordingly, the drift sheet resistance was also obtained. As used herein, 0.2 (mΩ·cm$^2$) was taken as the drift sheet resistance, and 0.05 (mΩ·cm$^2$) was taken as the electrode sheet resistance.

The ratio of substrate sheet resistance to characteristic ON-resistance was obtained by the value (%) of dividing the surface sheet resistance by the characteristic ON-resistance.

The in-plane distribution of the characteristic ON-resistance was measured by each I-V characteristic of the Schottky barrier diode produced in plane.

The characteristic ON-resistance distribution between substrates was measured from the average value of the in-plane distribution of each substrate.

The yield was obtained by the ratio (%) of the substrates having properties that are within 10% from the target value of the characteristic ON-resistance as to the fabrication of the 36 Schottky barrier diodes.

TABLE 2

|  |  | Group III nitride semi-conductor crystal substrate | Type of doping gas | Substrate sheet resistance ($\Omega \cdot cm^2$) | Characteristic ON-resistance ($\Omega \cdot cm^2$) | Ratio of substrate sheet resistance to characteristic ON-resistance (%) | In-plane distribution of characteristic ON-resistance (%) | Characteristic ON-resistance distribution between substrates (%) | Yield (%) |
|---|---|---|---|---|---|---|---|---|---|
| Examples of Present Invention | 19 | 1 | SiF$_4$ | 4.0 | 4.25 | 94 | 14 | 7 | 92 |
|  | 20 | 2 | SiF$_4$ | 0.4 | 0.65 | 62 | 10 | 5 | 99 |
|  | 21 | 3 | SiF$_4$ | 0.3 | 0.57 | 56 | 10 | 5 | 100 |
|  | 22 | 4 | SiF$_4$ | 0.04 | 0.29 | 14 | 2 | 1 | 100 |
|  | 23 | 5 | SiF$_4$ | 0.004 | 0.25 | 2 | 0.3 | 0.1 | 100 |
| Comparative Examples | 24 | 13 | SiH$_2$Cl$_2$ | 6.8 | 7.05 | 96 | 15 | 8 | 89 |
|  | 25 | 14 | SiH$_2$Cl$_2$ | 4.8 | 5.05 | 95 | 21 | 16 | 69 |
|  | 26 | 15 | SiH$_2$Cl$_2$ | 4.4 | 4.65 | 95 | 23 | 17 | 64 |
|  | 27 | 16 | SiH$_2$Cl$_2$ | 0.52 | 0.77 | 68 | 54 | 28 | 8 |

(Measurement Results)

It is appreciated from Table 2 that the Schottky barrier diode of Specimens 19-23 fabricated based on the group III nitride semiconductor crystal substrate of the present invention exhibited a low characteristic ON-resistance of not more than 4.25 $\Omega \cdot cm^2$ as compared to the Schottky barrier diode fabricated based on the group III nitride semiconductor crystal substrate of the Comparative Example.

The characteristic ON-resistance and also the ratio of substrate sheet resistance to characteristic ON-resistance also became lower as the resistivity of the employed group III nitride semiconductor crystal substrate was reduced. It was therefore appreciated that, by reducing the resistivity of the group III nitride semiconductor crystal substrate, the characteristic ON-resistance can be reduced and the influence of the resistivity distribution on the properties of the semiconductor device became smaller.

The Schottky barrier diode of Specimens 19-23 exhibited a lower in-plane distribution of characteristic ON-resistance and characteristic ON-resistance distribution between substrates, as compared to Specimens 24-27. Therefore, a high yield of at least 92% was exhibited.

In particular, Specimen 22 employing the group III nitride semiconductor crystal substrate of Specimen 4 exhibiting a resistivity of 1×10$^{-3}$ $\Omega \cdot cm$, a resistivity distribution in the diameter direction of at least −17% and not more than 17% and a resistivity distribution in the thickness direction of at least −8% and not more than 8%, as well as Specimen 23 employing the group III nitride semiconductor crystal substrate of Specimen 5 exhibiting a resistivity of 1×10$^{-3}$ $\Omega \cdot cm$, a resistivity distribution in the diameter direction of at least −17% and not more than 17% and a resistivity distribution in the thickness direction of at least −9% and not more than 9% had the characteristic ON-resistance greatly reduced to not more than 0.29 $\Omega \cdot cm^2$. The yield could be improved as high as to 100%.

In contrast, the Schottky barrier diode of Specimens 24-26 fabricated using the group III nitride semiconductor crystal substrate of Specimens 13-15 having a higher resistivity exceeding 0.1 $\Omega \cdot cm$ exhibited an extremely high characteristic ON-resistance.

In addition, the Schottky barrier diode of Specimen 27 fabricated using Specimen 16 having a resistivity distribution in the diameter direction outside the range of −30% to 30%, and a resistivity distribution in the thickness direction outside the range of −16% to 16% exhibited an extremely poor yield.

According to the present example, it was confirmed that a semiconductor device fabricated using a group III nitride semiconductor crystal substrate with a resistivity of at least 1×10$^{-4}$ $\Omega \cdot cm$ and not more than 0.1 $\Omega \cdot cm$, a resistivity distribution in the diameter direction of at least −30% and not more than 30%, and a resistivity distribution in the thickness direction of at least −16% and not more than 16% exhibited a low characteristic ON-resistance having variation suppressed, and yield improved.

Example 3

The effect of improving the properties of a semiconductor device fabricated using the group III nitride semiconductor crystal substrate of the present invention was studied. Specifically, the ON-resistance and breakdown voltage of the Schottky barrier diode of Specimens 20-23 fabricated in Example 2 were measured.

The breakdown voltage was measured for Specimens 20-23. Specifically, reverse voltage was applied, and the current and voltage characteristics were measured. The increased value of the leakage current in accordance with the increase of the reverse voltage was taken as the reverse voltage. The results are shown in FIG. 16.

Figure 16:
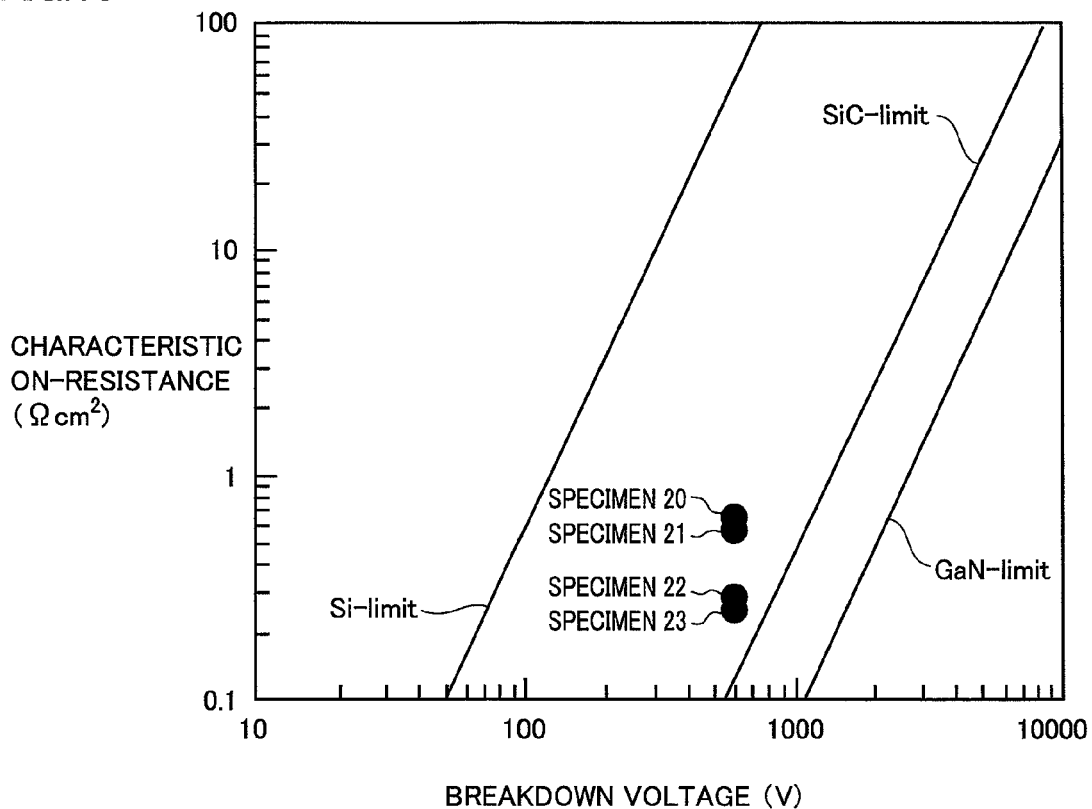
FIG. 16 is a diagram representing the relationship between the characteristic ON-resistance and reverse breakdown voltage of Schottky barrier diodes of Specimens 20-23 in Example 3.
Figure 17:
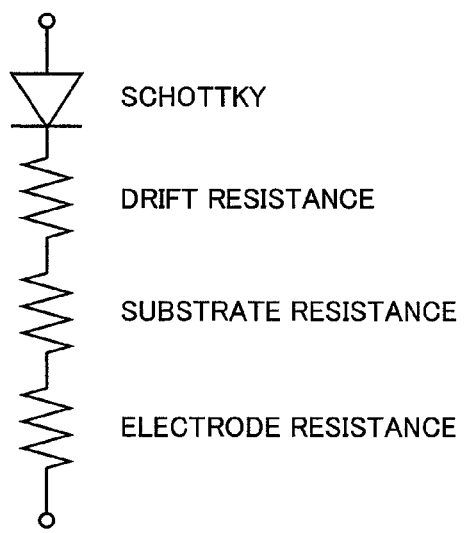
FIG. 17 is a diagram to describe the theoretical threshold value of Example 3.

In FIG. 16, the vertical axis represents the characteristic ON-resistance (unit: $\Omega \cdot cm^2$), and the horizontal axis represents the breakdown voltage (unit: V). In FIG. 16, GaN—limit, SiC—limit and Si—limit represent the theoretical threshold value that is the current standard of each material. Specifically, as shown in FIG. 17, in the case where other resistance components such as the substrate resistance and electrode resistance are so low that they can be neglected with respect to the drift resistance of the drift layer, the corresponding ON-resistance is taken as each theoretical threshold value since the ON-resistance will be the theoretical threshold value (for example, (11) M. Razeghi and M. Henini, Optoelectronic Device: 111-Nitrides (Elsevir, Oxford, 2004), Chapter 12).

(Measurement Result)

As shown in FIG. 16, the Schottky barrier diode fabricated using the group III nitride semiconductor crystal substrate of Specimens 2-5 of the present example exhibited a low characteristic ON-resistance, and maintained a high breakdown voltage of 600V.

According to the present example, it was confirmed that a Schottky barrier diode fabricated using a group III nitride semiconductor crystal substrate with a resistivity of at least 1×10$^{-4}$ $\Omega \cdot cm$ and not more than 0.1 $\Omega \cdot cm$, a resistivity distribution in the diameter direction of at least −30% and not more than 30%, and a resistivity distribution in the thickness direction of at least −16% and not more than 16% can have the properties improved such as a low characteristic ON-resistance and high breakdown voltage.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A group III nitride semiconductor crystal substrate having a diameter of at least 25 mm and not more than 160 mm, wherein
    a resistivity is at least $1 \times 10^{-4}$ Ω·cm and not more than 0.1 Ω·cm, and
    a resistivity distribution in a thickness direction is smaller than a resistivity distribution in a diameter direction,
    wherein an upper limit of the resistivity distribution in the diameter direction is obtained by (largest value−average value)/average value, and a lower limit of the resistivity distribution in the diameter direction is obtained by (smallest value−average value)/average value, and wherein an upper limit of the resistivity distribution in the thickness direction is obtained by (largest value−average value)/average value, and a lower limit of the resistivity distribution in the thickness direction is obtained by (smallest value−average value)/average value.

2. The group III nitride semiconductor crystal substrate according to claim 1, having a thickness of at least 2 mm and not more than 160 mm.

3. The group III nitride semiconductor crystal substrate according to claim 1, having a thickness of at least 100 μm and not more than 1000 μm.

4. The group III nitride semiconductor crystal substrate according to claim 1, wherein said resistivity is at least $1 \times 10^{-3}$ Ω·cm and not more than $8 \times 10^{-3}$ Ω·cm.

5. The group III nitride semiconductor crystal substrate according to claim 1, further comprising a silicon wherein a concentration of said silicon is at least $5 \times 10^{16}$ cm$^{-3}$ and not more than $5 \times 10^{20}$ cm$^{-3}$.

6. The group III nitride semiconductor crystal substrate according to claim 1, further comprising a silicon wherein a concentration of said silicon is at least $3 \times 10^{18}$ cm$^{-3}$ and not more than $5 \times 10^{19}$ cm$^{-3}$.

7. The group III nitride semiconductor crystal substrate according to claim 1, wherein a dislocation density is not more than $1 \times 10^7$ cm$^{-2}$.

8. The group III nitride semiconductor crystal substrate according to claim 1, wherein a main face has an angle of at least −5 degrees and not more than 5 degrees relative to any one of a (0001) plane, (1-100) plane, (11-20) plane and (11-22) plane.

9. The group III nitride semiconductor crystal substrate according to claim 1, wherein a full width at half maximum of a rocking curve in X-ray diffraction is at least 10 arcsec and not more than 500 arcsec.

10. The group III nitride semiconductor crystal substrate according to claim 1, formed of an Al$_x$In$_y$Ga$_{(1-x-y)}$N (0≤x≤1, 0≤y≤1, x+y≤1) crystal.

11. The group III nitride semiconductor crystal substrate according to claim 1, formed of a gallium nitride crystal.

12. A semiconductor device comprising:
    a group III nitride semiconductor crystal substrate defined in claim 1, and an epitaxial layer formed on said group III nitride semiconductor crystal substrate.

* * * * *